(12) United States Patent
Lu et al.

(10) Patent No.: US 9,726,983 B2
(45) Date of Patent: *Aug. 8, 2017

(54) METHOD TO DEFINE MULTIPLE LAYER PATTERNS WITH A SINGLE EXPOSURE BY CHARGED PARTICLE BEAM LITHOGRAPHY

(71) Applicant: TAIWAN SEMICONDUCTOR MANUFACTURING COMPANY, LTD., Hsin-Chu (TW)

(72) Inventors: Yen-Cheng Lu, New Taipei (TW); Chih-Tsung Shih, Hsinchu (TW); Jeng-Horng Chen, Hsin-Chu (TW); Shinn-Sheng Yu, Hsinchu (TW); Anthony Yen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/219,024

(22) Filed: Jul. 25, 2016

(65) Prior Publication Data

US 2017/0045827 A1 Feb. 16, 2017

Related U.S. Application Data

(63) Continuation of application No. 14/747,054, filed on Jun. 23, 2015, now Pat. No. 9,405,195, which is a continuation of application No. 14/030,875, filed on Sep. 18, 2013, now Pat. No. 9,081,312, which is a continuation-in-part of application No. 13/906,795, filed on May 31, 2013, now Pat. No. 8,791,024.

(60) Provisional application No. 61/823,312, filed on May 14, 2013.

(51) Int. Cl.
| | |
|---|---|
| *G03F 7/20* | (2006.01) |
| *G03F 1/78* | (2012.01) |
| *G03F 7/36* | (2006.01) |
| *H01L 21/027* | (2006.01) |
| *H01L 21/311* | (2006.01) |
| *H01L 21/768* | (2006.01) |
| *H01L 21/033* | (2006.01) |
| *G03F 7/095* | (2006.01) |

(52) U.S. Cl.
CPC ............ *G03F 7/70558* (2013.01); *G03F 1/78* (2013.01); *G03F 7/095* (2013.01); *G03F 7/20* (2013.01); *G03F 7/2022* (2013.01); *G03F 7/2037* (2013.01); *G03F 7/2059* (2013.01); *G03F 7/36* (2013.01); *H01L 21/0274* (2013.01); *H01L 21/0277* (2013.01); *H01L 21/0332* (2013.01); *H01L 21/0337* (2013.01); *H01L 21/31144* (2013.01); *H01L 21/76811* (2013.01); *H01J 2237/31769* (2013.01); *H01J 2237/31796* (2013.01)

(58) Field of Classification Search
CPC . G03F 1/78; G03F 7/20; G03F 7/2037; G03F 7/2059; G03F 7/36; G03F 7/095; G03F 7/2022; G03F 7/70558; H01L 21/0274; H01L 21/31144; H01L 21/0277; H01L 21/76811; H01L 21/0332; H01L 21/0337
USPC .................. 430/296, 312, 313, 394, 942
See application file for complete search history.

(56) References Cited

U.S. PATENT DOCUMENTS

| | | | |
|---|---|---|---|
| 5,230,772 | A | 7/1993 | Kadomura |
| 8,415,089 | B1 | 4/2013 | Gupta et al. |
| 8,791,024 | B1 | 7/2014 | Lu et al. |
| 9,081,312 | B2 | 7/2015 | Lu et al. |
| 9,405,195 | B2 * | 8/2016 | Lu ............ H01L 21/0274 |
| 2003/0000122 | A1 | 1/2003 | Vanek et al. |
| 2009/0000506 | A1 | 1/2009 | Jaede |
| 2009/0001202 | A1 | 1/2009 | Lesar et al. |
| 2009/0219496 | A1 | 9/2009 | Kamm et al. |
| 2010/0255409 | A1 | 10/2010 | Kang et al. |
| 2010/0297851 | A1 | 11/2010 | Bae et al. |
| 2012/0251930 | A1 | 10/2012 | Kojima et al. |

FOREIGN PATENT DOCUMENTS

| | | |
|---|---|---|
| CN | 101424878 A | 5/2009 |
| CN | 101593689 A | 12/2009 |

OTHER PUBLICATIONS

Chinese Patent Office, Chinese Office Action dated Jul. 4, 2016, Application No. 201310682235.9, 12 pages.

* cited by examiner

*Primary Examiner* — Christopher Young
(74) *Attorney, Agent, or Firm* — Haynes and Boone, LLP

(57) ABSTRACT

The present disclosure provides a method that includes forming a first patternable material layer on a substrate; forming a second patternable material layer over the first patternable material layer; and performing a charged particle beam lithography exposure process to the first patternable material layer and the second patternable material layer, thereby forming a first latent feature in the first patternable material layer.

20 Claims, 34 Drawing Sheets

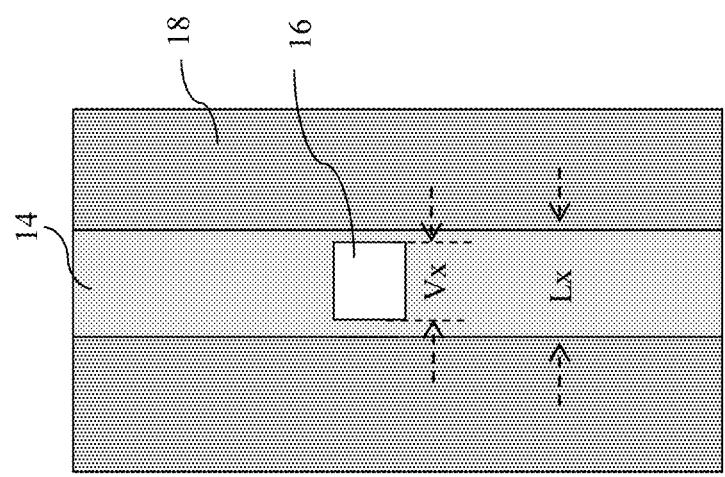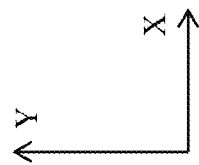
Fig. 8

METHOD TO DEFINE MULTIPLE LAYER PATTERNS WITH A SINGLE EXPOSURE BY CHARGED PARTICLE BEAM LITHOGRAPHY

PRIORITY AND CROSS-RELATION INFORMATION

This patent is a continuation of U.S. Ser. No. 14/747,054 filed Jun. 23, 2015 and entitled "Method to Define Multiple Layer Patterns with a Single Exposure by Charged Particle Beam Lithography," which is a continuation of U.S. Ser. No. 14/030,875 entitled "Method To Define Multiple Layer Patterns With A Single Exposure By E-Beam Lithography," filed Sep. 18, 2013, which is a continuation-in-part of U.S. Ser. No. 13/906,795 entitled "Method To Define Multiple Layer Patterns Using A Single Exposure," filed May 31, 2013, which claims the benefit of U.S. Provisional Application Ser. No. 61/823,312 entitled "Method to Define Multiple Layer Patterns Using a Single Exposure," filed May 14, 2013, the disclosures of which are hereby incorporated by reference in the entirety. This application is also related to U.S. patent application Ser. No. 14/030,755, filed on Sep. 18, 2013, and entitled "Photomask with Three States for Forming Multiple Layer Patterns with a Single Exposure," the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

ICs are commonly formed by a sequence of material layers, some of which are patterned by a photolithography process. It is important that the patterned layers properly align or overlay with adjacent layers. Proper alignment and overlay becomes more difficult in light of the decreasing geometry sizes of modern ICs. In addition, the surface topography of an underlying substrate, such as a semiconductor wafer, impacts the lithography imaging quality and further degrades the overlay tolerance between adjacent material layers. Furthermore, lithography processes are a significant contributor to the overall cost of manufacturing, including processing time and the cost of masks (also referred to as photomasks) used in the process. Therefore, what is needed is a lithography method to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 8 is a top view of the dosage map of FIG. 1, in portion.

DETAILED DESCRIPTION

Figure 1:
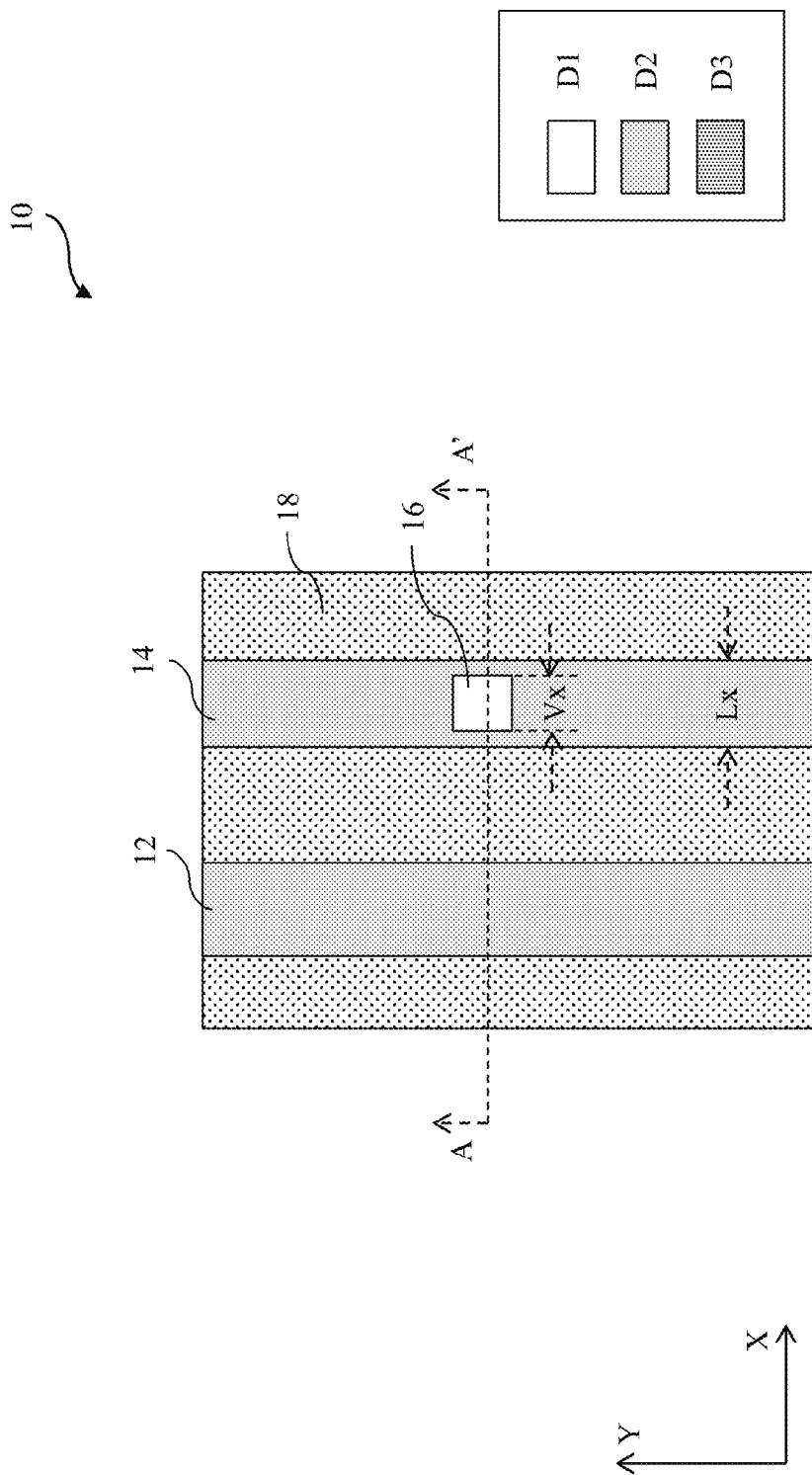
FIG. 1 is a dosage map constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is an electron-beam (e-beam) writing dosage map 10 for an electron-beam lithography patterning process. The dosage map 10 is constructed according to an integrated circuit (IC) pattern. It is understood that the dosage map 10 (and the IC pattern) may in fact be part of a larger, and more complicated dosage map (and IC pattern), not shown. The dosage map 10 is used in an e-beam lithography process to simultaneously expose two resist layers coated on a substrate (such as a semiconductor wafer) to form two different patterns on the two resist layers, respectively. The two resist layers include a first resist layer and a second resist layer disposed over the first resist layer. The dosage map 10 provides various dosage levels for the e-beam lithography patterning process. Especially, the IC pattern in the dosage map 10 defines a combined pattern that includes a first layer pattern and a second layer pattern. For example, the first layer pattern is a via pattern defining a plurality of via features and the second layer pattern is a metal line pattern defining a plurality of metal lines configured to form a portion of an interconnect structure for an integrated circuit. The dosage map 10 defines the IC pattern having a plurality of features from the first and second layer patterns, and further defines various exposure dosages associated with the plurality of features, respectively. During the e-beam lithography patterning process, one or more e-beams are utilized to perform an e-beam lithography exposure process with various dosage levels defined in the dosage map 10. Furthermore, the features from different layer patterns are assigned with different dosage levels.

In the present embodiment, the dosage map 10 includes three dosage levels (dosages) D1, D2 and D3, as illustrated in the legend of FIG. 1. The three dosage levels D1, D2 and D3 are different from each other. In the present example, the first dosage D1 is greater than the second dosage D2 and the second dosage D2 is greater than the first dosage D3. Furthermore, the features in the first layer pattern are assigned with the first dosage D1, the features in the second layer pattern are assigned with the second dosage D2, and the background region (also referred to as field) is assigned with the third dosage D3.

Figure 2:
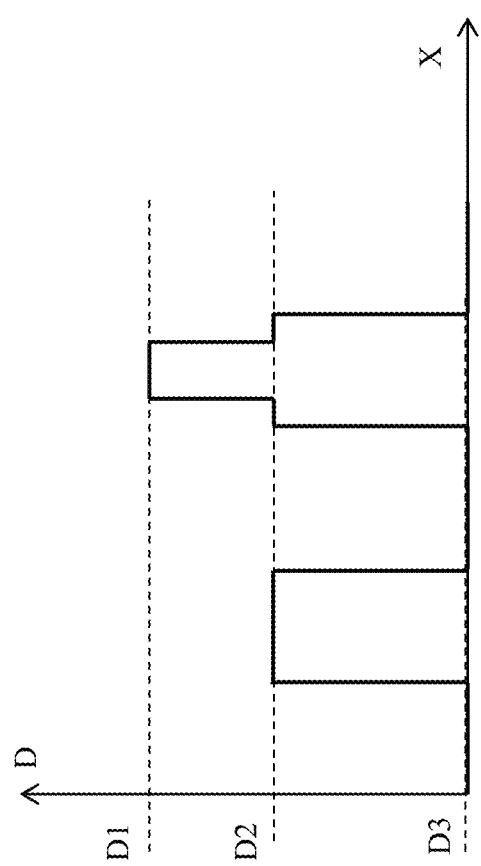
FIG. 2 diagrammatically illustrates a dosage profile of the dosage map of FIG. 1 along the dashed line A-A'.

FIG. 2 further diagrammatically illustrates a dosage profile of the dosage map 10 along the dashed line A-A' in the dosage map 10. The vertical axis represents the dosage "D" and the horizontal axis represents the dimension along the X direction.

As noted above, the IC pattern includes various features from the first layer pattern and the second layer pattern combined and collectively defined in the dosage map 10. In the present example for illustration, the IC pattern includes a first feature 12, a second feature 14 and a third feature 16. In furtherance of the present example, the first feature 12 and second features 14 are line features oriented in a first direction (such as the Y direction in FIG. 1). The third feature 16 is a via feature aligned with the second metal line. The third feature 16 is a feature in the first layer pattern (such as the via layer). The first and second features 12 and 14 are features in the second layer pattern (such as the metal line layer). In the integrated circuit to be formed in a semiconductor substrate, the via feature 16 is aligned with the second metal line 14. Accordingly, the third feature (via feature) 16 is overlapped with the second feature (metal line) 14 in the dosage map 10. In the present example, the third feature 16 has a dimension on the X direction less than the corresponding dimension of the second feature 14. The dosage map 10 also includes a background region (field) 18 without any pattern.

In the present embodiment, the features (such as the third feature 16) from the first layer pattern are assigned with the first dosage D1. The features (such as the first feature 12 and second feature 14) from the second layer pattern are assigned with the second dosage D2. The field is assigned with the third dosage D3.

The dosage map 10 may be defined in a lithography patterning data file in a proper format and be used by an e-beam lithography system during the e-beam lithography exposure process in a suitable mode (such as direct writing in raster mode or vector mode, or using a digital pattern generator). Various features in the dosage map 10 are transferred to two or more resist layers, respectively, by the e-beam radiation. In e-beam lithography, the resist layers are sensitive to e-beam radiation and are often referred to as e-beam sensitive resist layers. Alternatively, the dosage map 10 may be transferred to resist layers by other charged particle beams, such as ion beams.

Figure 3:
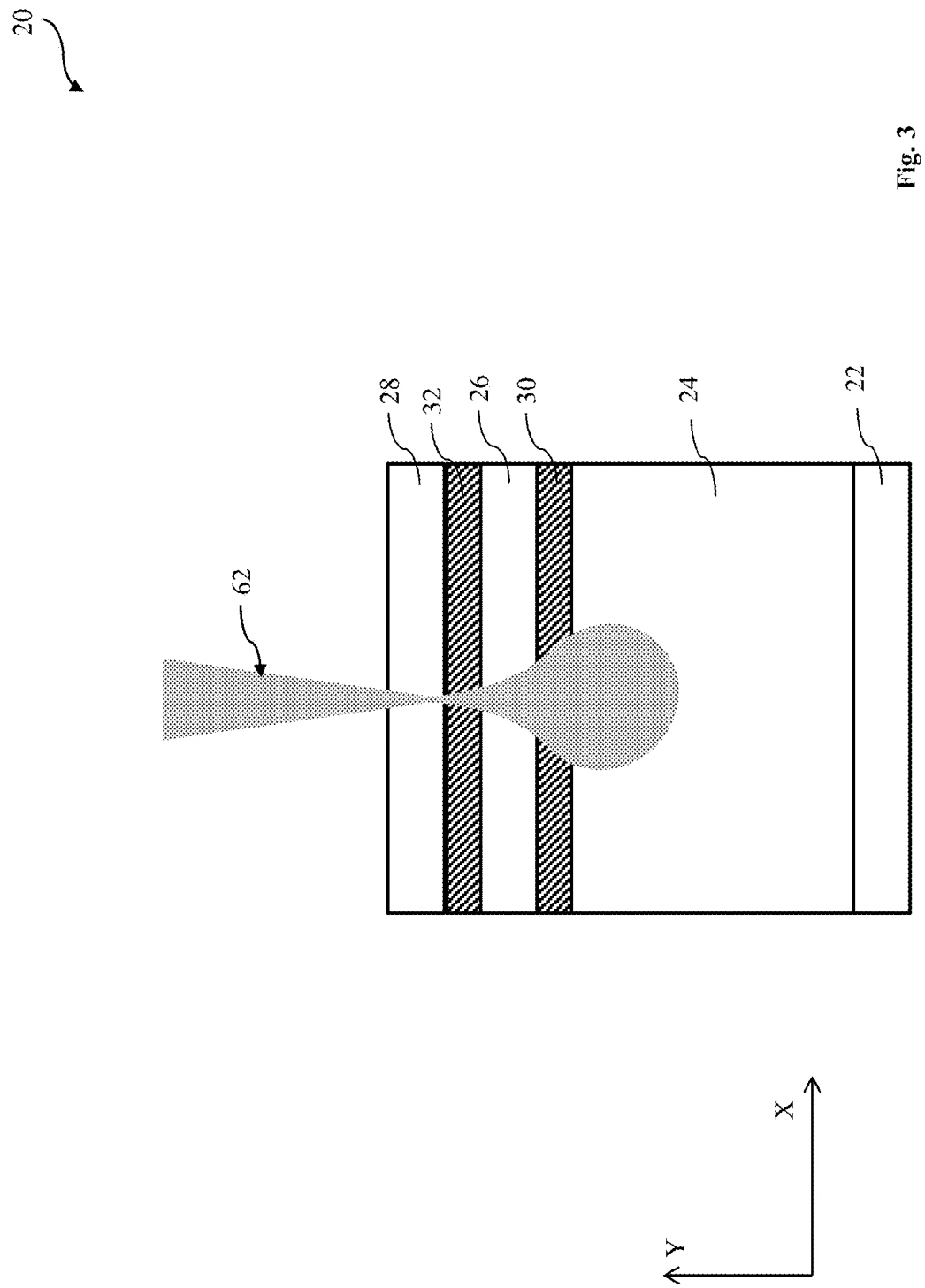
FIG. 3 is a sectional view of an example substrate during a lithography exposure process constructed according to aspects of the present disclosure.

FIG. 3 is a sectional view of a structure 20 to be patterned by an e-beam lithography patterning process according to the dosage map 10. The dosage map 10, the structure 20, and the method for e-beam patterning the structure 20 are collectively described in detail with reference to FIGS. 1-7.

The structure 20 includes a substrate 22. In one embodiment, the substrate 22 is a semiconductor substrate, such as silicon wafer. In another embodiment, the substrate 22 is a mask substrate, such as a fused quartz substrate or a low thermal expansion material (LTEM) substrate.

The structure 20 includes a material layer 24 formed on the substrate 22. The material layer 24 may include multiple films with same or different materials according to different embodiments. In one example where the substrate 22 is a semiconductor substrate, the material layer 24 includes a first dielectric material layer and a second dielectric material layer disposed on the first dielectric layer. An intermediate material layer, such as an etch stop layer may be disposed between the first and second dielectric material layers. In another example where the substrate 22 is a mask substrate, the material layer 24 includes a molybdenum silicon (MoSi) layer and a chromium (Cr) layer disposed on the MoSi layer.

A first resist layer 26 is coated on the material layer 24 and a second resist layer 28 is disposed on the first resist layer 26. The first and second resist layers 26 and 28 may be different in composition. For example, with different resist composition, the two resist layers have different sensitivities (exposure threshold). In one embodiment, other material layers, such as 30 and 32, may be formed between the resist layers and/or below the resist layers for one or more purpose, such as attenuation and/or isolation.

Referring to FIGS. 4 through 7, one way to describe the exposure of two resist layers 26 and 28 is to consider exposure intensities for the two layers.

Figure 4:
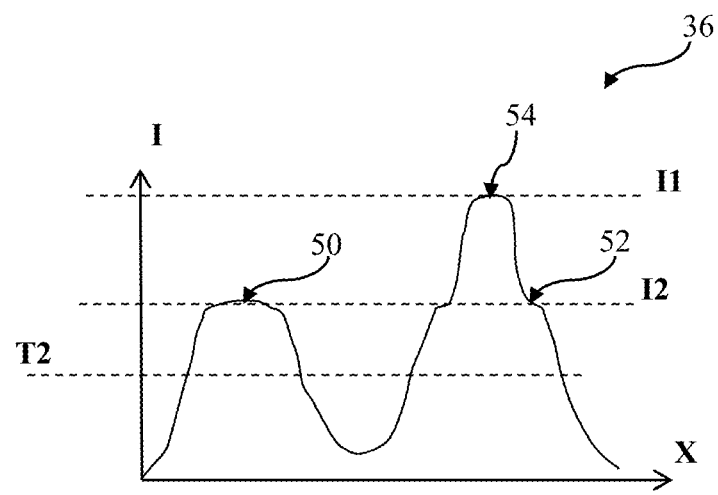
FIGS. 4 and 5 are diagrammatical views of various exposing intensity profiles during a lithography exposure process using the dosage map of FIG. 1, according to one or more embodiments of the present disclosure.

FIG. 4 illustrates an exposure intensity profile 36 of the second resist layer 28, which is the upper of the two resist layers in the present embodiment. Specifically, FIG. 4 graphically illustrates the exposure intensity distribution (vertical scale) across the width of the second resist layer 28 to be exposed (horizontal scale) corresponding to the dosage profile along the dashed line A-A' in the dosage map 10, which is illustrated in FIG. 2. The exposure intensity profile 36 may be different from the dosage profile in FIG. 2 due to various factors (such as scattering) during the e-beam exposure process.

Figure 5:
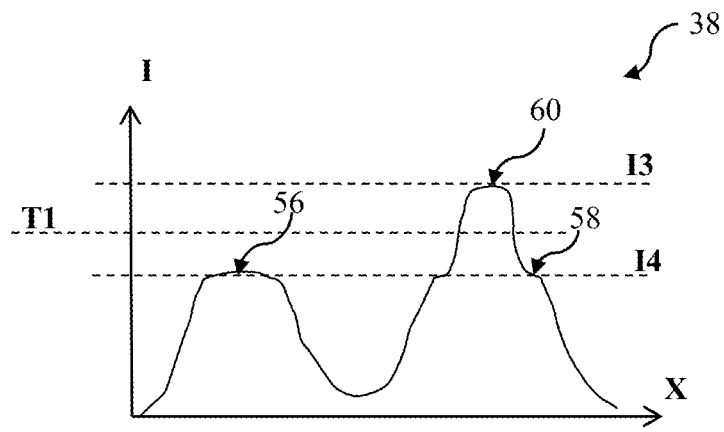

FIG. 5 illustrates an exposure intensity profile 38 of the first resist layer 26, which is the lower of the two resist layers in the present embodiment. Specifically, FIG. 5 graphically illustrates the exposure intensity distribution (vertical scale) across the width of the first resist layer 26 to be exposed (horizontal scale) corresponding to the dosage profile along the dashed line A-A' in the dosage map 10. The exposure intensity profile 38 may be different from the exposure intensity profile 36 due to various factors, which include the attenuation of the e-beam radiation from the second resist layer 28 and additionally from the material layer 32 (if present), and the further scattering by the second resist layer 28.

Figure 6:
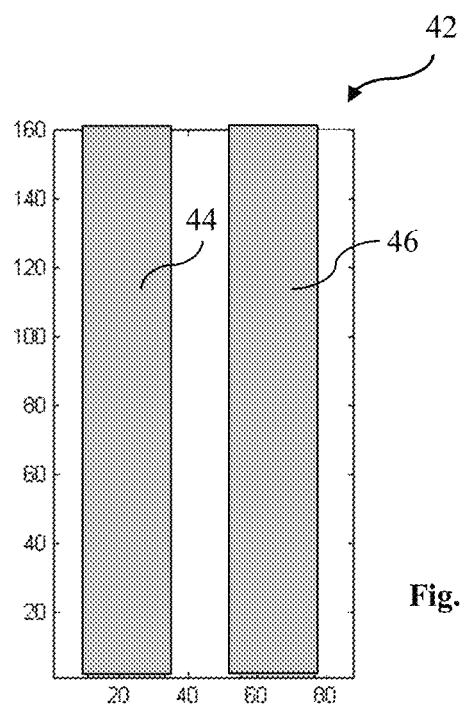
FIGS. 6 and 7 are top views of latent resist patterns in respective resist layers using the dosage map of FIG. 1.
Figure 7:
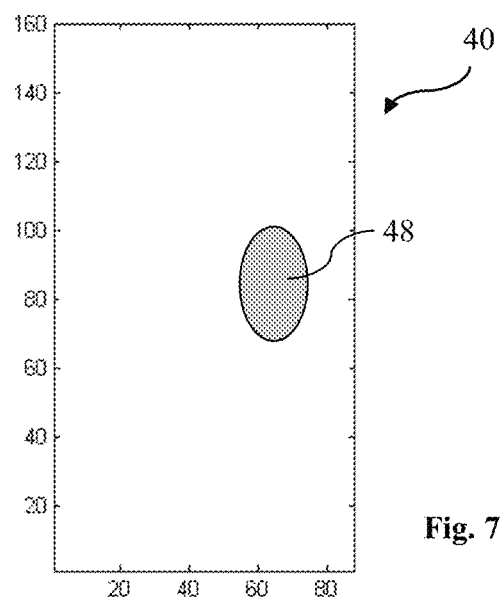

By the lithography exposure process with the IC pattern defined in the dosage map 10, latent patterns 40 and 42 are formed on the first and second resist layers 26 and 28, respectively, as illustrated in FIGS. 7 and 6. The latent pattern of a resist layer refers to the exposed pattern on the resist layer, which eventually becomes a physical resist pattern, such as by a developing process. In the present case, the latent patterns illustrated in FIGS. 6 and 7 are corresponding images of the exposed portions with exposing intensity equal to or greater than the respective exposure threshold.

In the present embodiment, the latent pattern 42 on the second resist layer 28, as illustrated in FIG. 6, includes a first feature 44 and a second feature 46. The latent pattern 40 on the first resist layer 26, as illustrated in FIG. 7, includes a third feature 48. The latent pattern 42 on the second resist layer 28 and the latent pattern 40 on the first resist layer 26 are different from each other. Therefore, by one exposure process, two resist layers are exposed with respective patterns. This is further explained below.

Each resist material has its respective exposure threshold to radiation (for example an e-beam of an e-beam system). When the exposing intensity (also referred to as exposing dosage) is equal to or greater than the exposure threshold, the corresponding portion of the resist is chemically changed such that it will be developed (e.g., it is removed by the developer when the resist is positive tone) in a developing process. When the exposing intensity is less than the exposure threshold, the corresponding portion of the resist is not chemically changed to be developed (e.g., it remains during the developing process when the resist is positive tone). It is understood that the term "changed" means that the resist has sufficiently changed to respond differently, e.g., as exposed positive-tone resist responds in the development process. In one example where the resist is positive tone, only portions of the resist exposed with exposing intensity equal to or greater than the exposure threshold are removed by a suitable developer during the developing process. Other portions of the resist unexposed or exposed with exposing intensity less than the exposure threshold remain after the developing process.

In another example where the resist is negative tone, the portions of the resist unexposed or exposed with exposing intensity less than the exposure threshold are removed by a suitable developer during the developing process. Other portions of the resist exposed with exposing intensity equal to or greater than the exposure threshold remain after the developing process.

In the present embodiment, the first and second resist layers are both positive tone. During the lithography exposure process using the dosage map 10, both the first and second resist layers are exposed to form respective latent patterns 40 and 42 as illustrated in FIGS. 7 and 6, respectively, due to one or more factors.

In one embodiment, the first resist layer and the second resist layer are designed to have different exposure thresholds. The first resist layer 26 has a relatively high exposure threshold T1 and the second resist layer 28 has a relatively low exposure threshold T2, i.e., less than that of the first resist layer.

In FIG. 4, the exposure intensity profile 36 of the second resist layer 28 includes a left portion corresponding to the first feature 12 in the dosage map 10 and a right portion corresponding to the second feature 14 and third feature 16. Accordingly, the exposure intensity profile 36 includes a first peak 50 in the left portion and a step shoulder 52 in the right portion, both having an intensity $I_2$ associated with the second dosage D2. The exposure intensity profile 36 further includes a second peak 54 in the right portion, having an intensity $I_1$ associated with the first dosage D1. In an ideal situation where there is no e-beam radiation loss before reaching the second resist layer 28 and during traveling through the second resist layer 28, the intensities $I_1$ and $I_2$ are substantially equal to the dosage levels D1 and D2. The resist material of the second resist layer 28 and the dosage map 10 are designed such that the second threshold T2 is less than the intensity $I_2$. Thus, the first and second features 12 and 14 in the dosage map 10 are imaged to form respective first feature 44 and second feature 46 in the latent pattern 42 during the e-beam exposure process, as illustrated in FIG. 6. Third feature 16 is also imaged to the latent pattern 42 but is overlapped with the second feature 46.

In FIG. 5, the exposure intensity profile 38 of the first resist layer 26 includes a left portion corresponding to the first feature 12 in the dosage map 10 and a right portion corresponding to the second feature 14 and third feature 16. Accordingly, the exposure intensity profile 38 includes a first peak 56 in the left portion and a step shoulder 58 in the right portion, both having an intensity $I_4$ associated with the second dosage D2. The exposure intensity profile 38 further includes a second peak 60 in the right portion, having an intensity $I_3$ associated with the first dosage D1. The intensities $I_3$ and $I_4$ may be less than the intensities $I_1$ and $I_2$, respectively, due to one or more attenuation mechanisms. The resist material of the first resist layer 26 and the dosage map 10 are designed such that the first threshold T1 is less than the intensity $I_3$ but is greater than the intensity $I_4$. Thus, the first and second features 12 and 14 in the dosage map 10 are not imaged in the latent pattern but the third feature 16 in the dosage map 10 is imaged to form the third latent feature 48 in the latent pattern 40 during the e-beam exposure process, as illustrated in FIG. 7.

Since the first resist layer 26 has a higher exposure threshold T2, the first latent pattern 40 formed thereon by the e-beam lithography exposure process is different from that of the second resist layer 28. By one e-beam exposure process using the dosage map 10, two different latent patterns 40 and 42 are respectively formed in the two resist layers 26 and 28.

By properly choosing various dimensions of the IC pattern defined on the dosage map 10, the first and second latent patterns are formed on the respective resist layer with proper dimensions (dimensions on wafer or DOW) in best focus (BF). In one example, the features (such as 12 and 14) of the second layer pattern are tuned according to a first size bias to form the latent pattern 42 in the second resist layer 28 with proper dimension. The features (such as 16) of the first layer pattern are tuned with a second size bias different from the first size bias to form the corresponding latent pattern 40 in the first resist layer 26 with proper dimensions.

In one example illustrated in FIG. 1, the third feature 16 is designed with a first dimension Vx in the X direction relative to the corresponding dimension Lx of the second feature 14, where Vx is less than Lx. The third feature 16 is imaged to the first resist layer 26 to form the latent feature 48 with a greater dimension by the e-beam lithography exposure process due to the characteristics of the e-beam 62 as illustrated in FIG. 3. The e-beam 62 experiences strong scattering and Coulomb's force through the first and second resist layers. Therefore, the beam radius in the first resist layer 26 is expanded to a greater dimension.

For the e-beam lithography exposure process, the dosage map 10 is designed to have different biases to the features in the first layer pattern and the second layer pattern. The bias includes two or more freedoms, such as dosage and size, to tune CDs of various features.

In another embodiment, an attenuation mechanism is provided such that the exposing intensity to the first resist layer is less than the exposing intensity to the second resist layer to form different latent patterns on respective resist layers. In this embodiment, the exposure threshold to the first resist layer may be chosen as same as that of the second resist layer or alternatively different. In one example, the second resist layer attenuates the exposing e-beam radiation such that only a portion of the exposing beam reaches to the first resist layer. In another example illustrated in FIG. 3, the attenuating material layer 32 is inserted between the first and second resist layers. The attenuating material layer 32 absorbs the exposing e-beam radiation such that the exposing beam reaching the first resist layer 26 is only a portion of the exposing e-beam radiation projected on the second resist layer 28. Thus the exposing intensity to the first resist layer 26 is less than the exposing intensity to the second resist layer 28. Accordingly, based on the exposing intensity and the exposure threshold, the latent pattern on the first resist layer 26 is different from the latent pattern formed on the second resist layer 28. Particularly, when the first exposure threshold T1 associated with the first resist layer 26 is greater than I4 and less than I3 (as illustrated in FIG. 5), the first feature 12 and the second feature 14 defined in the dosage map 10 are not imaged to the first resist layer 26. The third feature 16 is imaged to the first resist layer 26 by the e-beam lithography exposure process, thereby forming the latent feature 40 as illustrated in FIG. 7. As a comparison, the second exposure threshold T2 associated with the second resist layer 28 is less than both I1 and I2 (as illustrated in FIG. 4), both the first feature 12 and the second feature 14 defined in the dosage map 10 are imaged to the second resist layer 28, thereby forming the latent feature 42 as illustrated in FIG. 6. The third feature 16 is also imaged to the second resist layer 28 but the corresponding latent feature is overlapped with the latent feature 46.

In various embodiments, by properly choosing dosage levels (as defined in the dosage map 10), choosing the exposure threshold through tuning of the resist materials, choosing the exposing intensity through various attenuation mechanisms (resist or inserting an attenuating material layer), adjusting various dimensions of the IC design pattern, or a combination thereof, the different patterns are formed on respective resist layers with proper dimensions.

Thereafter, the two resist layers are developed to form a first resist pattern in the first resist layer and a second resist pattern in the second resist layer. Other manufacturing operations follow to transfer the two resist patterns to the substrate. In one example, one or more etch operations are implemented to transfer the two resist patterns to respective underlying material layers on the substrate.

By the disclosed method, two resist layers are simultaneously exposed to form respective patterns by one e-beam lithography exposure process. Therefore, both the manufacturing cost and manufacturing cycle time are reduced. Other benefits may present in various embodiments. In one embodiment, the two resist patterns, therefore, the two respective patterns transferred to the underlying material layers, are intrinsically aligned since they are printed from the same IC pattern.

The method to simultaneously pattern two resist layers and the semiconductor structure made thereby are further described below according to various embodiments.

FIG. 8 is a top view of a dosage map portion 80 of the dosage map 10 (FIG. 1, which itself may be a portion of a larger dosage map) defining an IC pattern constructed according to aspects of the present disclosure in one embodiment. The dosage map 80 includes three dosage levels D1, D2 and D3, constructed to define line feature 14 and via feature 16. Especially, the via feature 16 is defined by the first dosage D1, the line feature 14 is defined by the second dosage D2 less than D1, and the field region 18 is defined by the third dosage D3 less than D2. In the present case, D3 is zero. The line feature 14 and the via feature 16 are intersecting with the line feature. The line feature 14 is designed to form a first integrated circuit feature (also referred to as first main feature) in a first material layer (metal line layer) on a circuit substrate (such as a semiconductor wafer). The via feature 16 is designed to form a second integrated circuit feature (also referred to as second main feature) in a second material layer (via feature layer) on the circuit substrate. The second material layer is underlying the first material layer. The line feature 14 is oriented in the Y direction. In the present embodiment, the IC pattern is designed to form a portion of an interconnect structure. In furtherance of the embodiment, the line feature 14 is designed to form a metal line in the circuit substrate. The via feature 16 is designed to connect and electrically couple the metal line to another metal line in a metal layer below the via feature. Alternatively, the via feature 16 is designed to form a contact feature to connect and electrically couple the metal line to a gate electrode or a doped semiconductor feature (such as source or drain) in the circuit substrate.

For the sake of example, the following discussion will describe using the dosage map 80 of FIG. 8 in a semiconductor structure 100, shown in various fabrication stages in FIGS. 9 through 21.

Figure 9:
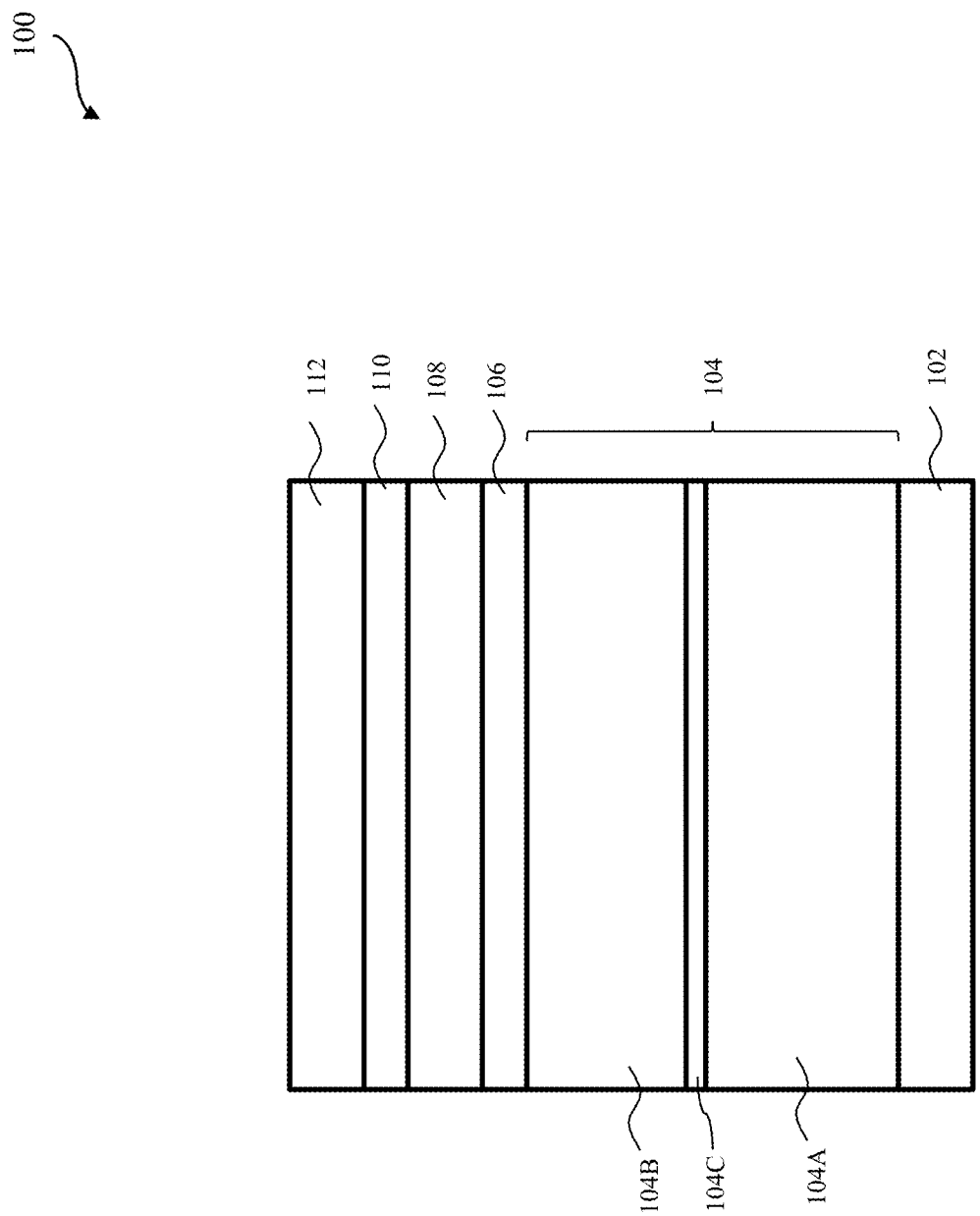
FIGS. 9 through 21 are sectional views of a semiconductor structure at various fabrication stages constructed according to one or more embodiments of the present disclosure and using the dosage map of FIG. 8.

Referring to FIG. 9, a semiconductor substrate 102 is provided. In the present embodiment, the semiconductor substrate 102 includes silicon. Alternatively, the substrate 102 includes germanium, silicon germanium or other suitable semiconductor material, such as diamond, silicon carbide or gallium arsenic. The substrate 102 may further include additional features and/or material layers, such as various isolation features formed in the substrate. The substrate 102 may include various p-type doped regions and/or n-type doped regions configured and coupled to form various devices and functional features. All doping features may be achieved using a suitable process, such as ion implantation in various steps and techniques. The substrate 102 may include other features, such as shallow trench isolation (STI) features. The substrate 102 may also include a portion of an interconnect structure that includes metal lines in various metal layers, via features to provide vertical connection between the metal lines in the adjacent metal layers, and contact features to provide vertical connection between the metal lines in the first metal layer and various device features (such as gates, sources and drains) on the substrate.

Still referring to FIG. 9, various material layers are formed on the substrate 102. In the present embodiment, a dielectric material layer 104 is formed on the substrate 102. The dielectric material layer 104 may include plurality of dielectric films. In the present embodiment, the dielectric material layer 104 includes a first interlayer dielectric (ILD)

material 104A formed on the substrate 102. The first ILD material layer 104A includes a dielectric material, such as silicon oxide, low k dielectric material, other suitable dielectric material or combination thereof.

The dielectric material layer 104 includes a second ILD material layer 104B formed over the first ILD material layer 104A. The second ILD material layer 104B is similar to the first ILD material layer 104A in terms of composition and formation. For example, the second ILD material layer 104B includes a dielectric material, such as silicon oxide, low k dielectric material, other suitable dielectric material or combination thereof.

The dielectric material layer 104 includes an etch stop layer 104C formed between the first and second ILD material layers. The etch stop layer 104C has an etch selectivity to the ILD material and functions to stop etch during subsequent operation to pattern the ILD material layers. The etch stop layer 104C is different from the ILD material in composition and includes another dielectric material, such as silicon nitride, silicon oxynitride or silicon carbide. Various dielectric materials may be deposited by a suitable technique, such as chemical vapor deposition (CVD), spin-on coating or other suitable method.

Two resist layers are subsequently formed on the dielectric material layer 104. Specifically, a first resist layer 108 is formed over the dielectric material layer 104. The first resist layer 108 is formed by spin-on coating or other suitable technique. A second resist layer 112 is formed over the first resist layer 108. The second resist layer 112 is formed by spin-on coating or other suitable technique. Other steps, such as baking, may follow the coating of each resist layer. The first and second resist layers may have similar or different compositions from each other, according to various embodiments. Two resist layers include a same resist material or different resist materials sensitive to e-beam radiation. In one example, the resist material includes polymethyl methacrylate (PMMA).

In one embodiment, the second resist layer 112 is different from the first resist layer 108 and is formed directly on the first resist layer 108. The first and second resist layers are configured to be exclusively dissolved in separate, respective developers. Specifically, a first developer is used to develop the first resist layer 108 and a second developer is used to develop the second resist layer 112. The first developer is different from the second developer. The first resist layer is dissoluble in the first developer but indissoluble in the second developer. The second resist layer is dissoluble in the second developer but indissoluble in the first developer. In another embodiment, the first developer and the second developer are the same although the first resist and second resist are indissoluble mutually. In that way, only one development process is needed. In one example, the first and second resist layers are chosen to have different exposure thresholds. In another example, the second resist layer 112 attenuates the exposing beam during the lithography exposure process such that the exposing beam projected on the second resist layer 112 is partially absorbed and only a portion of the exposing beam reaches the first resist layer 108. Thus the exposing intensities to the first and second resist layers are different. Specifically, the exposing intensity to the first resist layer 108 is less than the exposing intensity to the second resist layer 112. In this case, the exposure thresholds of the first and second resist layers may be chosen to be the same, or different. In another example, the first resist layer 108 has a thickness ranging between about 20 nm and about 60 nm. In another example, the second resist layer 112 has a thickness ranging between about 20 nm and about 40 nm.

In another embodiment, a material layer 110 is formed between the first and second resist layers. In this embodiment, the two resist layers may be same in composition or different. The material layer 110 is inserted there-between to serve one or more functions. In one example, the material layer 110 separates the first and second resist layers from each other if those two resist layers are mutually dissoluble. In another example, the material layer 110 functions to absorb the exposing beam such that the exposing beam projected on the second resist layer 112 is partially absorbed and only a portion of the exposing beam reaches the first resist layer 108. Thus the exposing intensity to the first resist layer 108 is less than the exposing intensity to the second resist layer 112. In another example, the material layer 110 functions as a hard mask during subsequent operations to pattern the dielectric material layer 104. The material layer 110 is formed on the first resist layer 108 before the coating of the second resist layer 112.

The material layer 110 includes a dielectric material, such as aluminum oxide ($Al_2O_3$), silicon oxide ($SiO_2$), silicon nitride (SiN), titanium oxide (TiO), or other suitable material. The material layer 110 is formed by spin-on coating or low temperature deposition without damage to the underlying resist layer 108. For example, the material layer 110 of aluminum oxide is deposited by spin-on coating. In another example, the material layer 110 of silicon oxide, silicon nitride, or titanium oxide, is formed by a low temperature deposition, such as CVD at low temperature. In one example, the material layer 110 has a thickness ranging between about 10 nm and about 20 nm.

In another embodiment, a second material layer 106 is formed between the dielectric material layer 104 and the first resist layer 108. In the present embodiment, the second material layer 106 functions as a hard mask layer during the subsequent operations to pattern the dielectric material layer 104. The second material layer 106 may be different from the material layer 110 or alternatively same. For example, the second material layer 106 may include aluminum oxide. The second material layer 106 is formed on the dielectric material layer 104 before the coating of the first resist layer 108. The second material layer 106 may include one or more films to enhance the operations of patterning the dielectric material layer 104.

Figure 10:
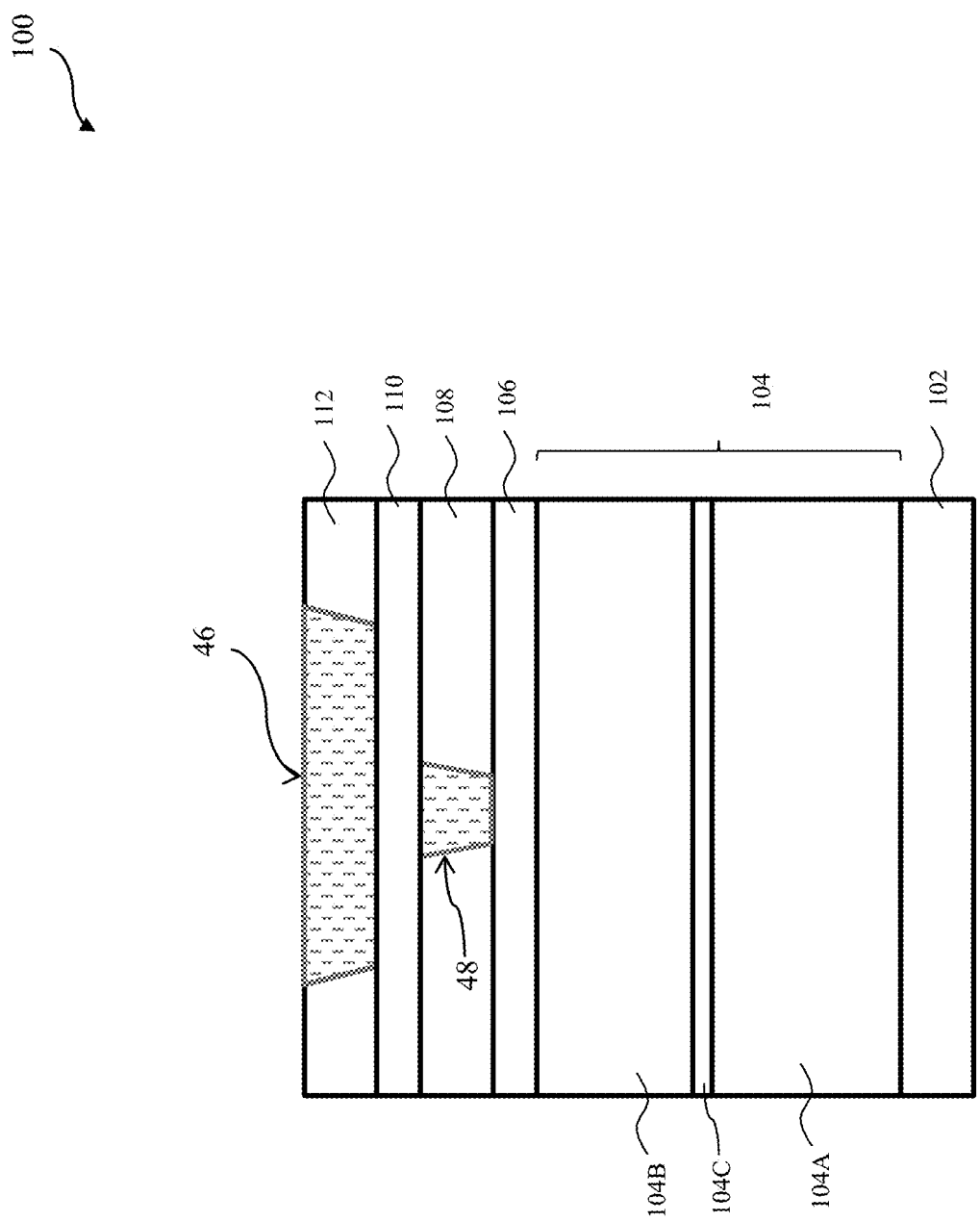

Referring to FIG. 10, an e-beam lithography exposure process is implemented using the dosage map 80 to simultaneously expose both the first and second resist layers, thereby forming latent patterns on respective resist layers. During the e-beam lithography exposure process, the IC pattern defined in the dosage map 80 is imaged to the second resist layer 112 and the first resist layer 108. A first latent pattern is formed in the first resist layer 108 and a second latent pattern is formed in the second resist layer 112. A latent pattern is referred to as a portion of the resist layer that is exposed but not developed yet. The first and second latent patterns are different from each other due to different exposing intensities, different exposure thresholds or both, as described above with reference to FIGS. 1 through 7. However, the first and second latent patterns are related since both are images of the same IC pattern defined on the dosage map 80. In the present example, the first latent pattern 40 includes a first latent feature 48 associated with the via feature 16 and the second latent pattern 42 includes a second latent feature 46 associated with the line feature 14 defined in the dosage map 80. The top views of the latent features 48 and 46 are described with reference to FIGS. 6 and 7, as noted above with respect to the dosage map 10.

The e-beam lithography exposure process may be implemented in various modes, including vector mode and raster mode. In one example, the e-beam lithography exposure process is implemented in a raster mode where the exposure dosage is dynamically varying according to the dosage map 80. In another example, the e-beam lithography exposure process is implemented in a vector mode where the line feature 14 and the via feature 16 are sequentially written with the respective dosage. Specifically, the via feature 16 is written using the first dosage D1 and thereafter the line feature 14 is written using the second dosage D2, or vice versa. More generally, the features in the first layer pattern are written using the first dosage D1 and thereafter the features in the second layer pattern are written using the second dosage, or vice versa. The field region 18 is not written since the corresponding dosage D3 is zero. Thus, the dosage, accordingly the e-beam intensity is not frequently changed. Other operations, such as post-exposure-baking (PEB), may follow the lithography exposure process.

Figure 11:
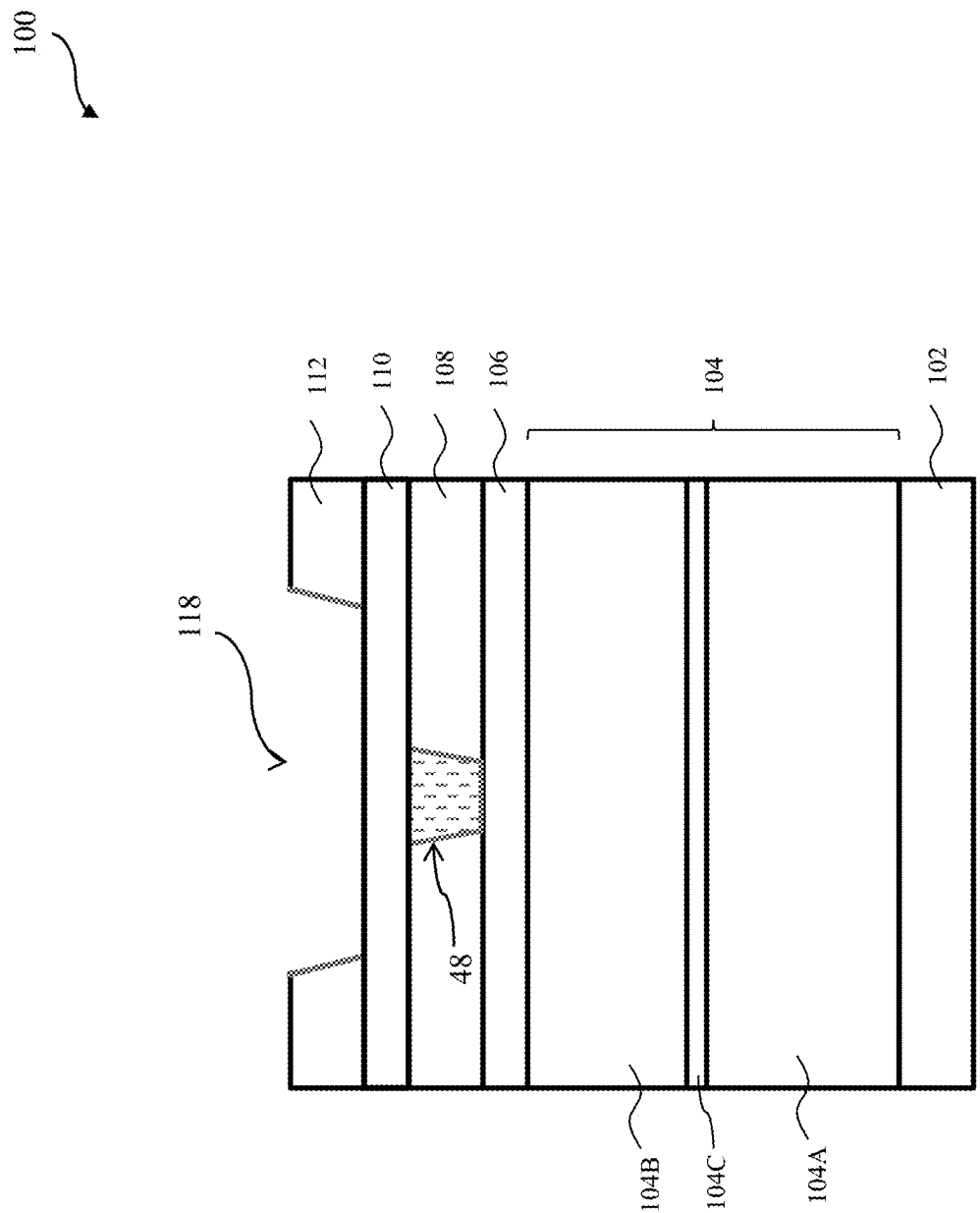

Referring to FIG. 11, the second resist layer 112 is developed by the corresponding developer. In the present embodiment, both the first and second resist layers are positive tone. The exposed portion (the latent feature 46) of the second resist layer 112 is removed in the developer, thereby forming a patterned second resist layer having an opening 118 associated with the second latent feature 46. Other operations, such as hard baking, may follow the developing process.

Figure 12:
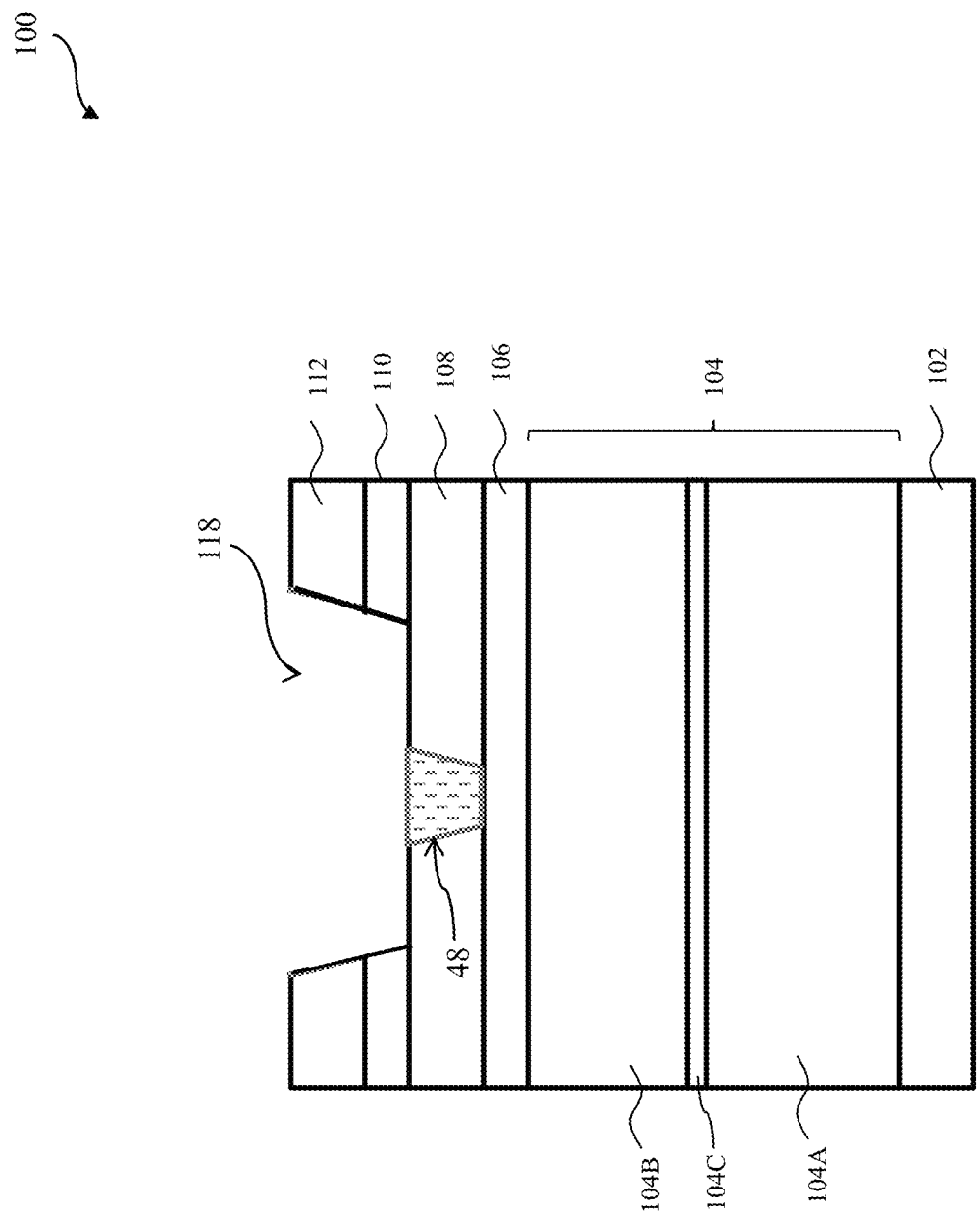

Referring to FIG. 12, an etch process is applied to selectively etch the material layer 110 and remove the portion of the material layer 110 aligned within the opening 118. The etch process and the etchant are properly chosen for selective etch without damage to the resist.

Figure 13:
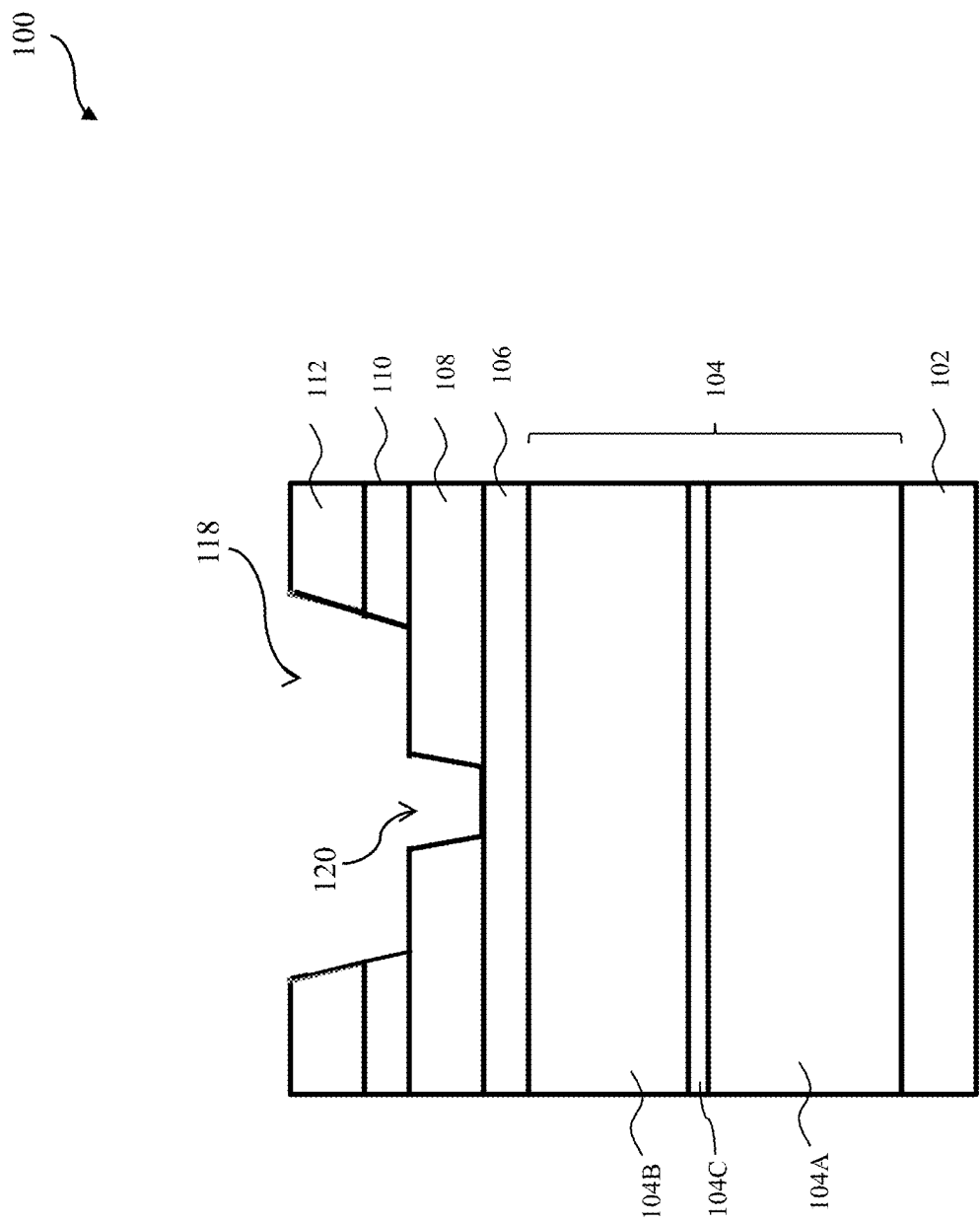

Referring to FIG. 13, the first resist layer 108 is developed by the corresponding developer. In the present embodiment, the first resist layer is positive tone. The exposed portion (the first latent feature 48) is removed in the developer, thereby forming a patterned first resist layer having an opening 120 associated with the first latent feature 48. Other operations, such as hard baking, may follow the developing process.

Figure 14:
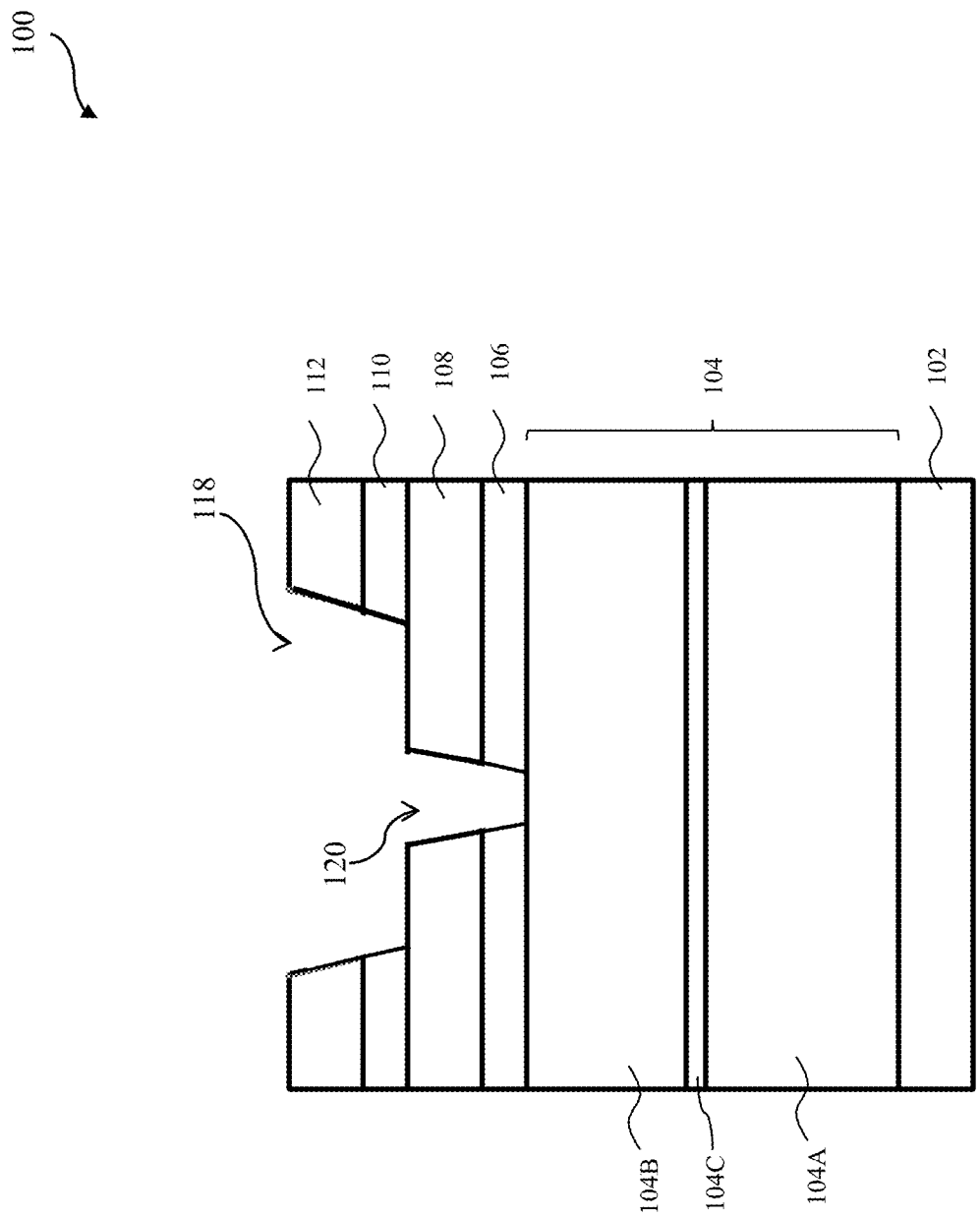

Referring to FIG. 14, another etch process is applied to selectively etch the second material layer 106 and removes the portion of the second material layer 106 aligned with the opening 120 uncovered by the patterned first resist layer 106. The etch process and the etchant are properly chosen for selective etch without damage to the resist.

Figure 15:
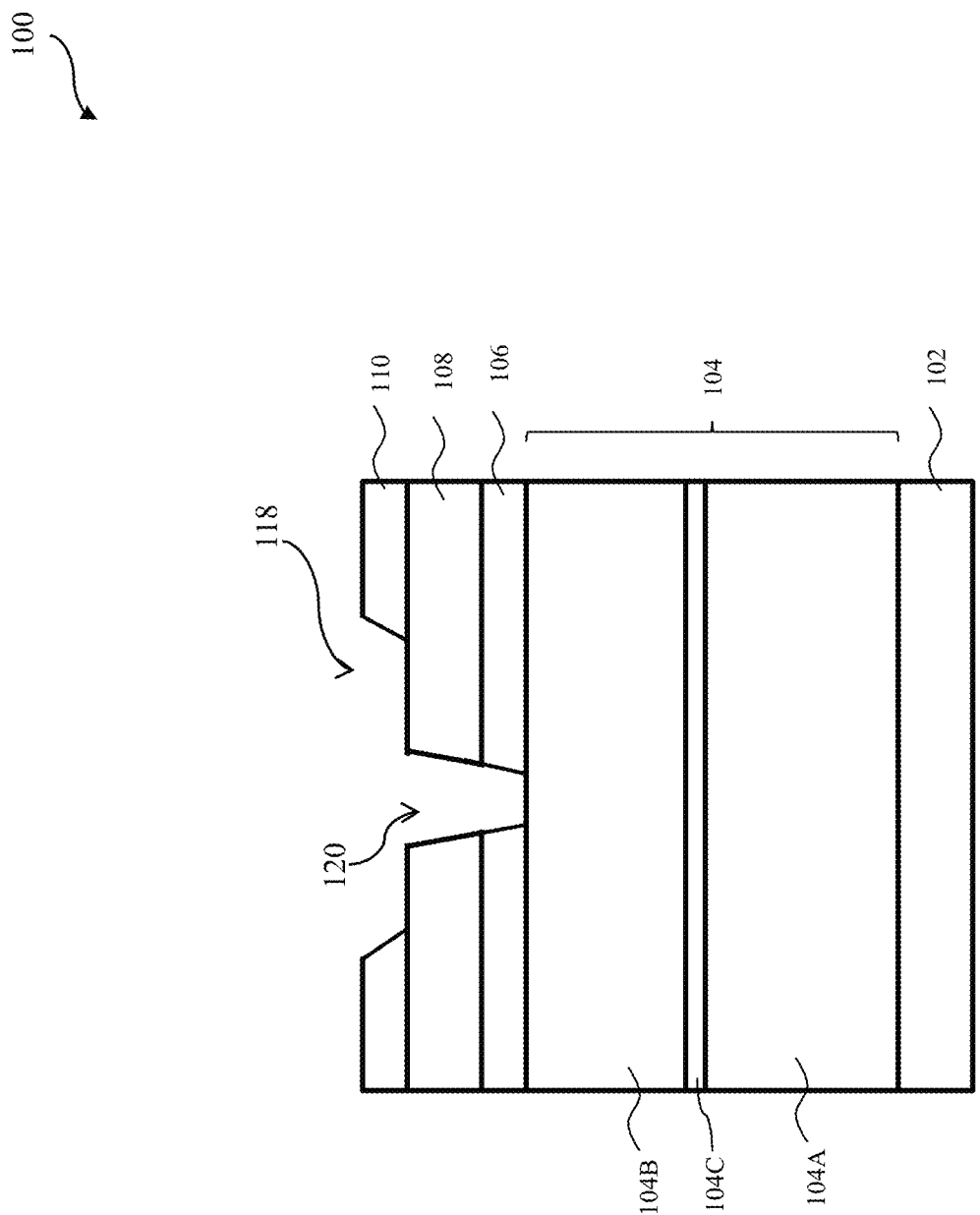

Referring to FIG. 15, the second resist layer 112 may be removed by a suitable process, such as wet stripping or plasma ashing.

Other operations are applied to transfer the openings 118 and 120 to the respective material layers. One embodiment is further described below.

Figure 16:
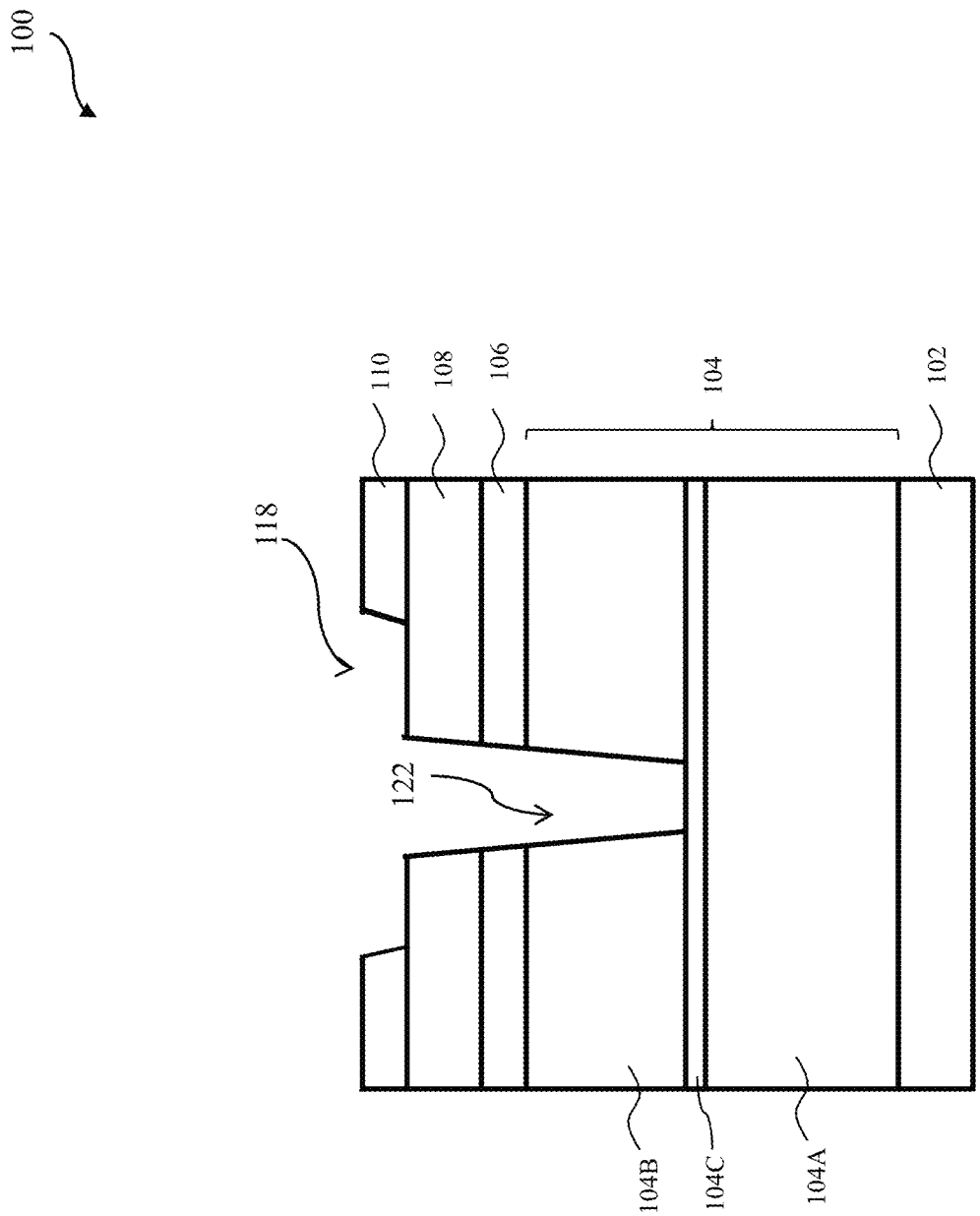

Referring to FIG. 16, an etch process is applied to selectively etch the second ILD material layer 104B within the opening 120, thereby forming a trench 122 in the second ILD material layer 104B. The etch process stops on the etch stop layer 104C. The etch process is properly chosen to form the trench 122. For example, dry etch, wet etch, or a combination thereof, may be applied for transferring the opening 120 to the second ILD material layer 104B, forming the trench 122.

Figure 17:
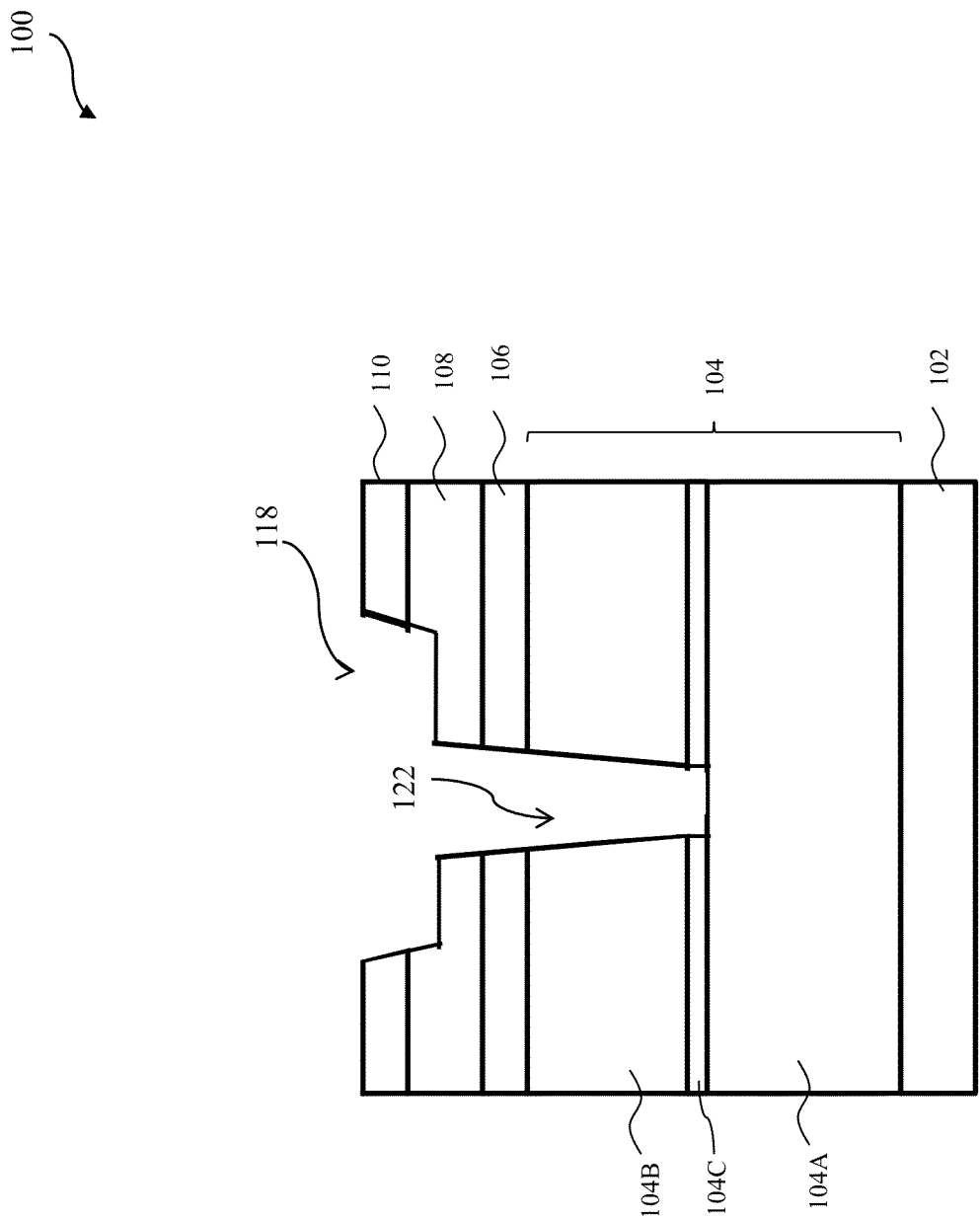

Referring to FIG. 17, another etch process is applied to selectively etch the etch stop layer 104C within the trench 122, using a suitable etch technique and etchant. In one embodiment, a wet etch may be applied to open the etch stop layer 104C. For example where the etch stop layer 104C includes silicon oxide, a hydrofluoride (HF) may be used as etchant to etch the etch stop layer 104C.

Figure 18:
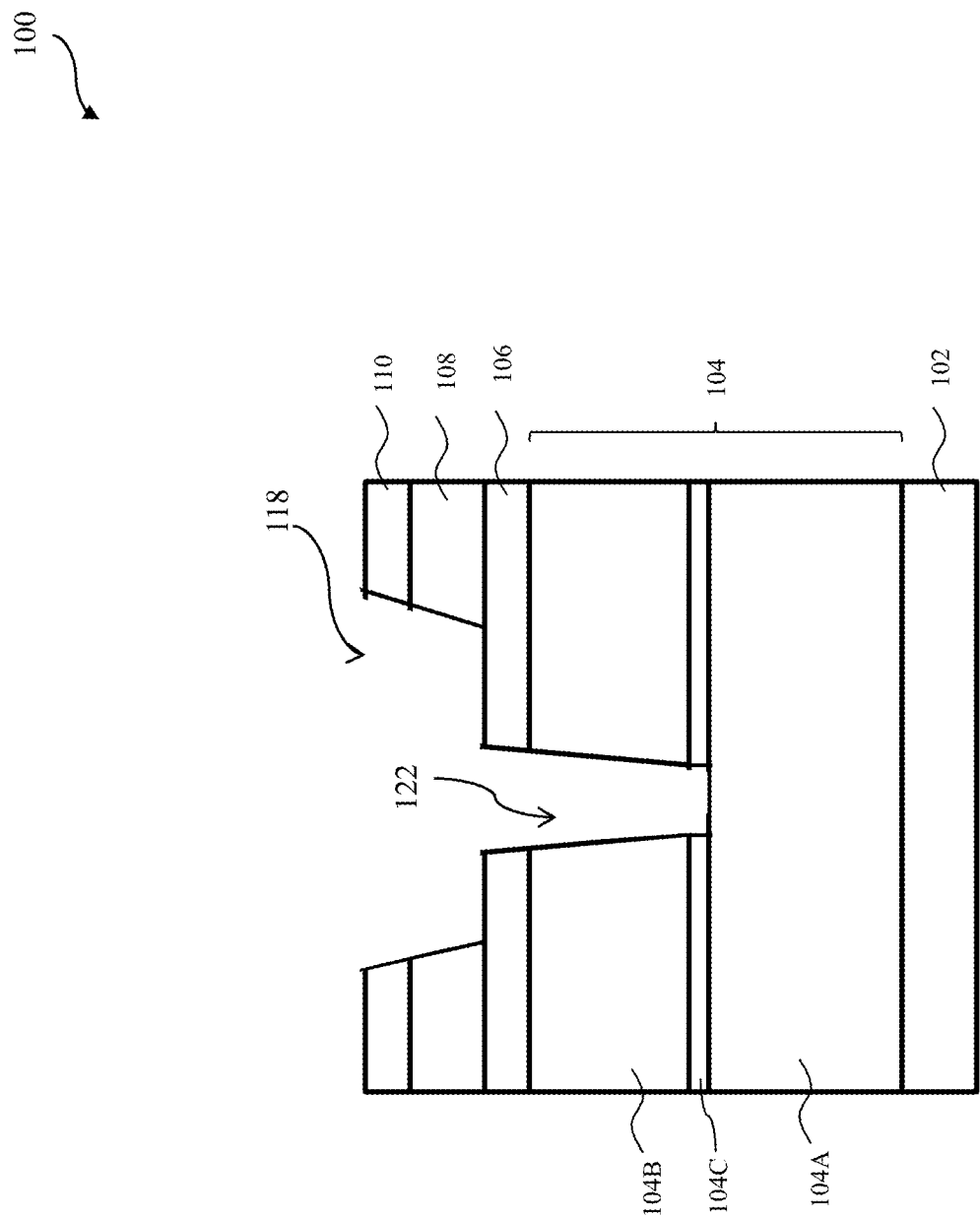

Referring to FIG. 18, a trimming process is applied to trim the first resist layer 108, thereby transferring the opening 118 from the material layer 110 to the first resist layer 108. The uncovered portion of the first resist layer 108 is removed by the trimming process. In one embodiment, the trimming process is similar to a resist strip process. For example, the trimming process implements wet stripping.

Figure 19:
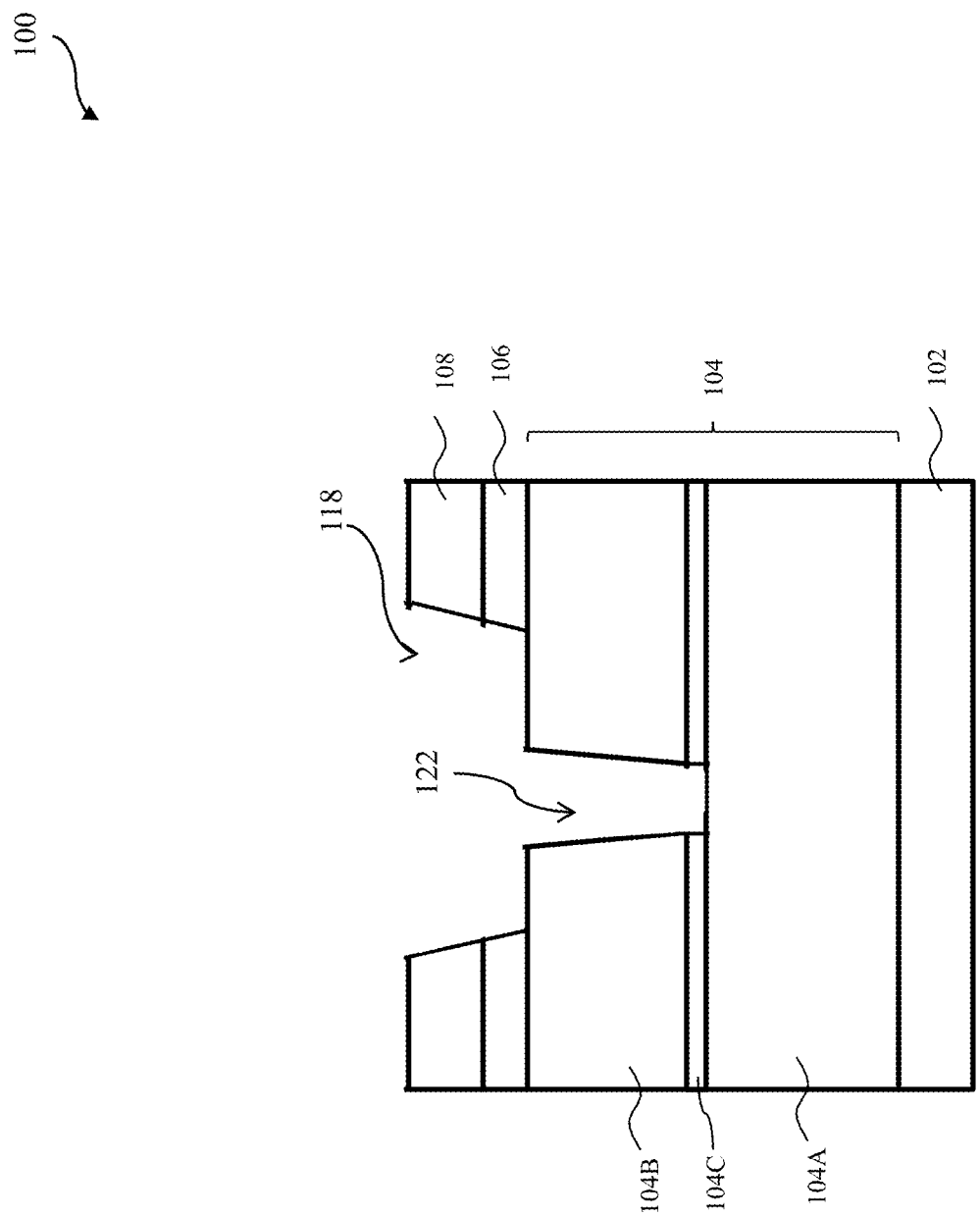

Referring to FIG. 19, an etch process is applied to etch the material layer 106 within the opening 118, thereby transferring the opening 118 to the material layer 106. In one embodiment, the material layer 106 and the material layer 110 includes a same material (such as aluminum oxide), the etch process opens the material layer 106 and removes the material layer 110 as well.

Figure 20:
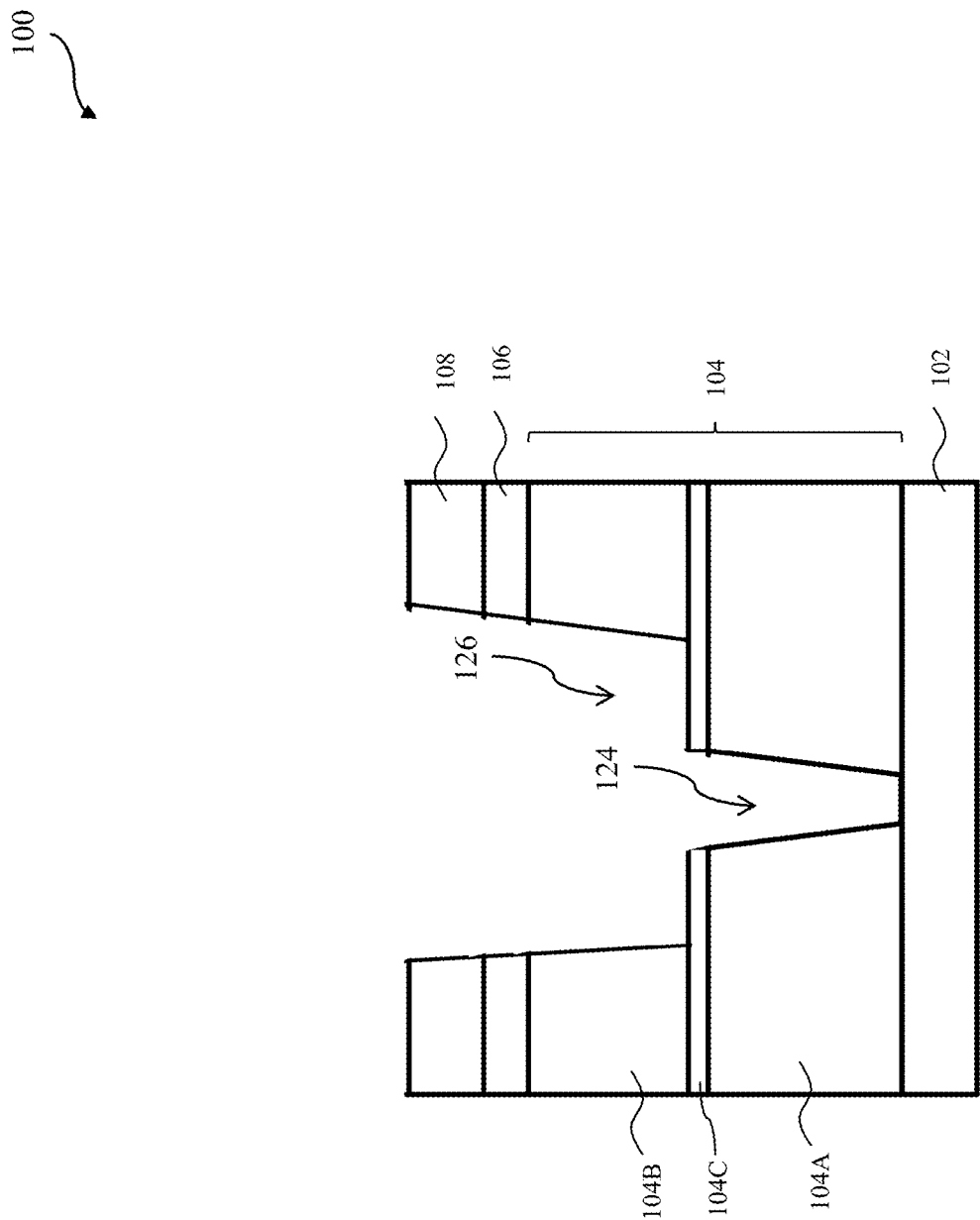

Referring to FIG. 20, another etch process is applied to selectively etch both the first ILD material layer 104A and the second ILD material layer 104B using the material layer 106 as an etch mask, thereby forming a first trench 124 for the via feature in the first ILD material layer 104A and a second trench 126 for the metal line in the second ILD material layer 104B. In the present embodiment, the first and second ILD material layers include a same dielectric material. The etch process recesses both the first and second ILD material layers. The etch process is properly chosen for selective etch. For example, dry etch may be applied to form the via trench 124 and metal line trench 126 in respective ILD material layers.

In some embodiments, another etch stop layer is disposed between the substrate 102 and the first ILD material layer 104A such that the etch process properly stops on the etch stop layer. In this case, the etch stop layer can be subsequently opened by another etch for proper electrical connection. In another embodiment, an underlying metal layer is formed below the first ILD material layer and the via trench 126 is properly aligned with the underlying metal line for electrical connection. Other operations may be subsequently implemented. For example, the first resist layer 108 may be removed by wet stripping or plasma ashing.

Although the procedure to form the via trench 124 and the metal line trench 126 is provided above according to one or more embodiments, other procedure may be alternatively applicable to form the via trench 124 and the metal line trench 126 using the patterned first and second resist layers.

In another embodiment where the material layer 110 is not present, various etch operations applied to the material layer 110 are eliminated.

Figure 21:
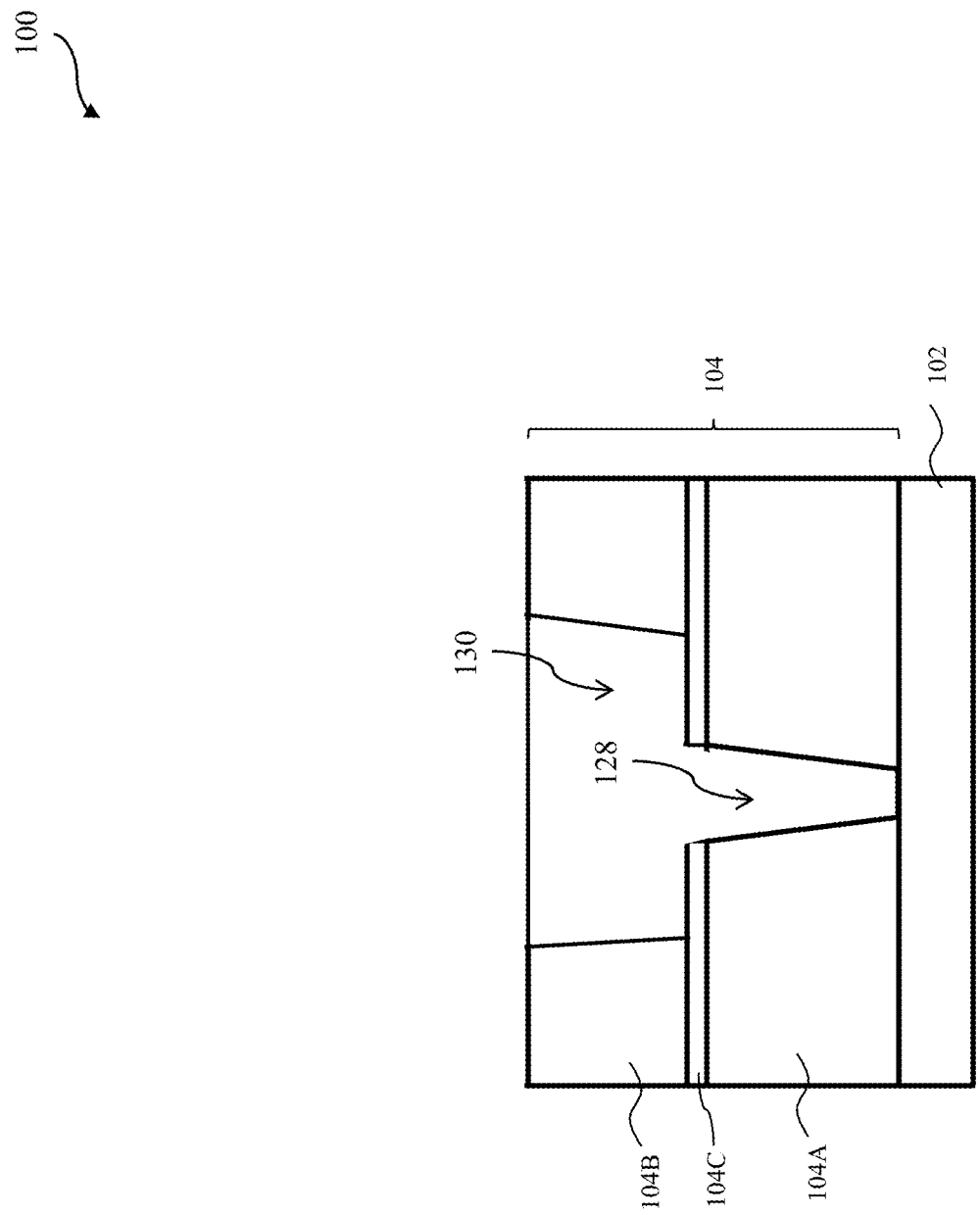

Referring to FIG. 21, via feature 128 and metal line 130 are formed by a suitable procedure. In one embodiment, a conductive material, such as metal or metal alloy, is filled in the via trench 124 and the metal line trench 126 (FIG. 20) by deposition, such as physical vapor deposition (PVD). A chemical mechanical polishing (CMP) process is applied to remove excessive conductive material and to planarize the top surface.

In another embodiment, the material layer 106 may serve as a polishing stop layer and may be removed after the CMP process by an etch process. In a particular example, copper is used as the conductive material. In furtherance of this example, a copper seed layer is formed by PVD. Thereafter, bulk copper is filled in the trenches 124 and 126 by plating. A CMP process is subsequently applied to remove the excessive copper and planarize the top surface. In yet another embodiment, a lining material, such as titanium nitride, is formed on the sidewalls of the via trench 124 and the metal line trench 126 before filling in the trenches with the conductive material. The lining layer is deposited by a proper technique, such as PVD or CVD. The lining layer may function as a diffusion barrier and adhesive layer for integrity of the interconnect structure.

Although not shown, other processing operation may be presented to form various doped regions such as source and drain regions and/or devices features such as gate electrode. In one example, the substrate may alternatively include other material layer to be patterned by the disclosed method, such as another patterned metal layer. In another example, additional patterning steps may be applied to the substrate to form a gate stack. In another example, the source and drain features are of either an n-type dopant or a p-type dopant are formed by a conventional doping process such as ion implantation.

Figure 22:
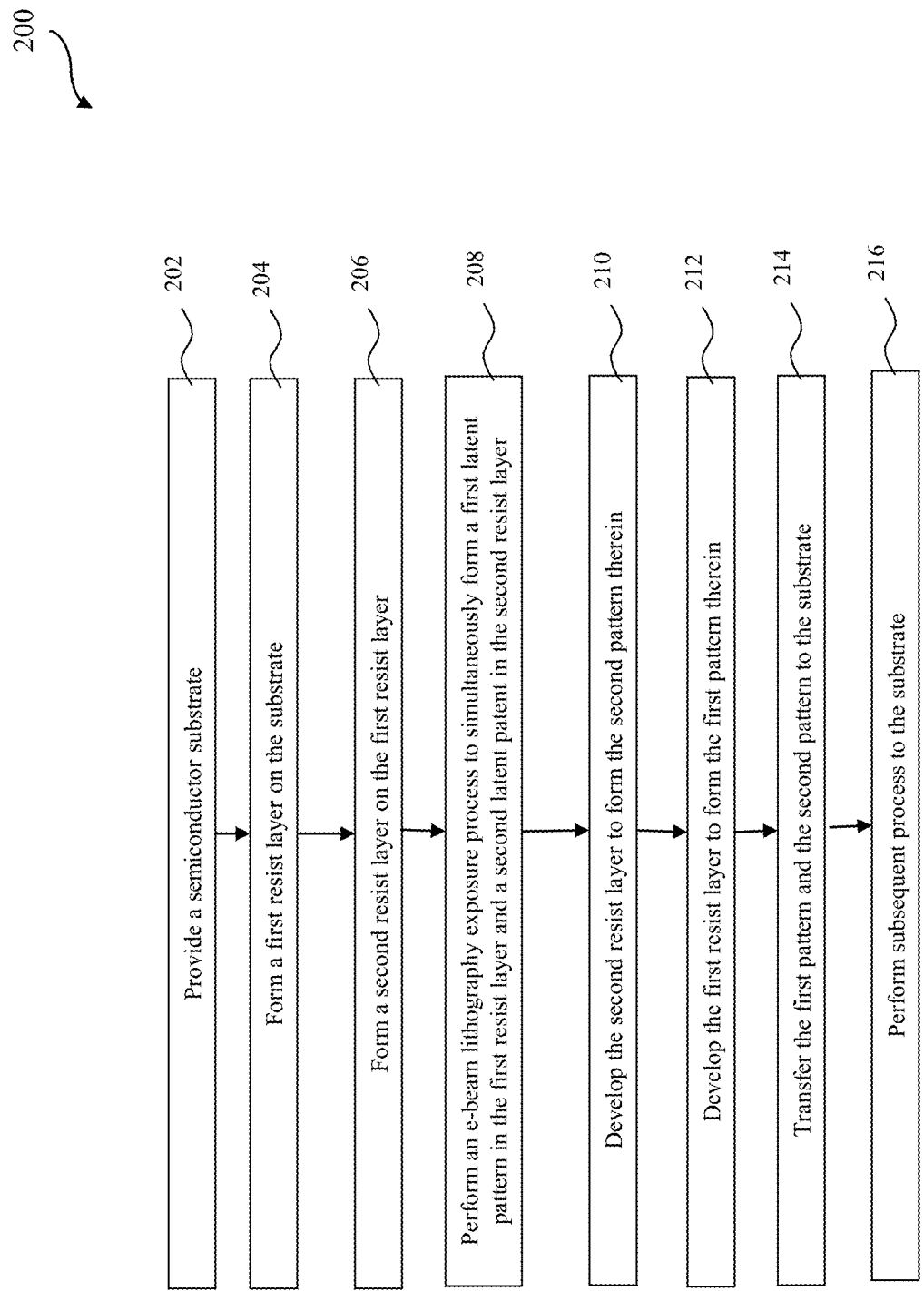
FIG. 22 is a flowchart of a method making a semiconductor structure constructed according to one or more embodiments of the present disclosure.

FIG. 22 is a flowchart of a method 200 of exposing two resist layers with respective latent patterns by single lithography exposure process, constructed according various aspects in one or more embodiments. The method 200 starts at 202 with a substrate, such as a semiconductor wafer. The substrate may further include one or more material layers, such as one or more patterned layers and one or more layers to be patterned.

At operation 204, a first resist layer is formed on the substrate. Forming of the first resist layer includes coating the first resist layer on the substrate by a suitable technique, such as spin-on coating. Other manufacturing steps, such as baking, may further be applied to the first resist layer.

At operation 206, a second resist layer is formed on the first resist layer. Forming of the second resist layer includes coating the second resist layer on the substrate by a suitable technique, such as spin-on coating. Other manufacturing steps, such as baking, may further be applied to the second resist layer.

The first and second resist layers may be the same or different in composition. In one embodiment, the second resist layer is different from the first resist layer in the exposure threshold. In another embodiment, the second resist layer is different from the first resist layer as they are developed with different developers and are exclusively indissoluble in the opposite developer. In another embodiment, a material layer is inserted between the first and second resist layer for separation, attenuation and/or etch mask.

The method 200 proceeds to operation 208 by performing an e-beam lithography exposure process to simultaneously expose both the first and second resist layers, thereby forming a first latent pattern in the first resist layer and a second latent pattern in the second resist layer. The first and second patterns are different from each other and define respective patterns to be transformed in different material layers.

The e-beam lithography exposure process exposes the two resist layers according to a dosage map with three dosage levels, such as dosage map 10 or 80. The three dosage levels D1, D2 and D3 are constructed to define various features from two layer patterns. Especially, the IC pattern defined in the dosage map includes a first plurality of features for a first layer pattern and a second plurality of features for a second layer pattern. The first plurality of features are defined with the first dosage D1 and the second plurality of features are defined with the second dosage D2 in the dosage map.

The dosage levels and dimensions of the first layer patent and second layer pattern are tuned through exposure thresholds, attenuation to the exposing intensity and adjusting the corresponding IC design pattern according to different size biases. In one embodiment, the IC pattern is defined in a data file and is transferred to the resist layers by direct writing or other suitable technique, such as digital pattern generator. Other steps may be implemented. In one embodiment, a post exposure baking process may be applied to the first and second resist layers after the lithography exposure process.

The method 200 proceeds to operation 210 by developing the second resist layer to form the patterned second resist layer. The second resist layer with the second latent pattern is converted to the patterned second resist layer with various openings thereby. In one embodiment, the second resist layer is positive tone, and the portions of the second resist layer associated with the second latent pattern are removed by the corresponding developer, resulting in the openings in the second resist layer (the second resist layer with the second pattern converted from the second latent pattern).

The method 200 proceeds to operation 212 by developing the first resist layer to form the patterned first resist layer. The first resist layer with the first latent pattern is converted to the patterned first resist layer with various openings. In one embodiment, the first resist layer is positive tone, and the portions of the first resist layer associated with the first latent pattern are removed by the corresponding developer, resulting in the openings in the first resist layer. Thereafter, other steps may be implemented. In one embodiment, one or more baking processes may be applied to the first and second resist layers collectively or separately.

The method 200 proceeds to operation 214 by transferring the first pattern and the second pattern to the substrate or underlying material layers on the substrate. The operation 214 may include one or more etch processes, such as those various embodiments associated with FIGS. 9 through 21. In one embodiment, a via trench and a metal line trench are formed in respective ILD material layers. Other manufacturing operations may be implemented before, during or after the method 200. In one embodiment, a procedure including metal deposition and CMP is implemented thereafter to form a via feature (or contact feature) and a metal line overlapped and aligned.

Figure 23:
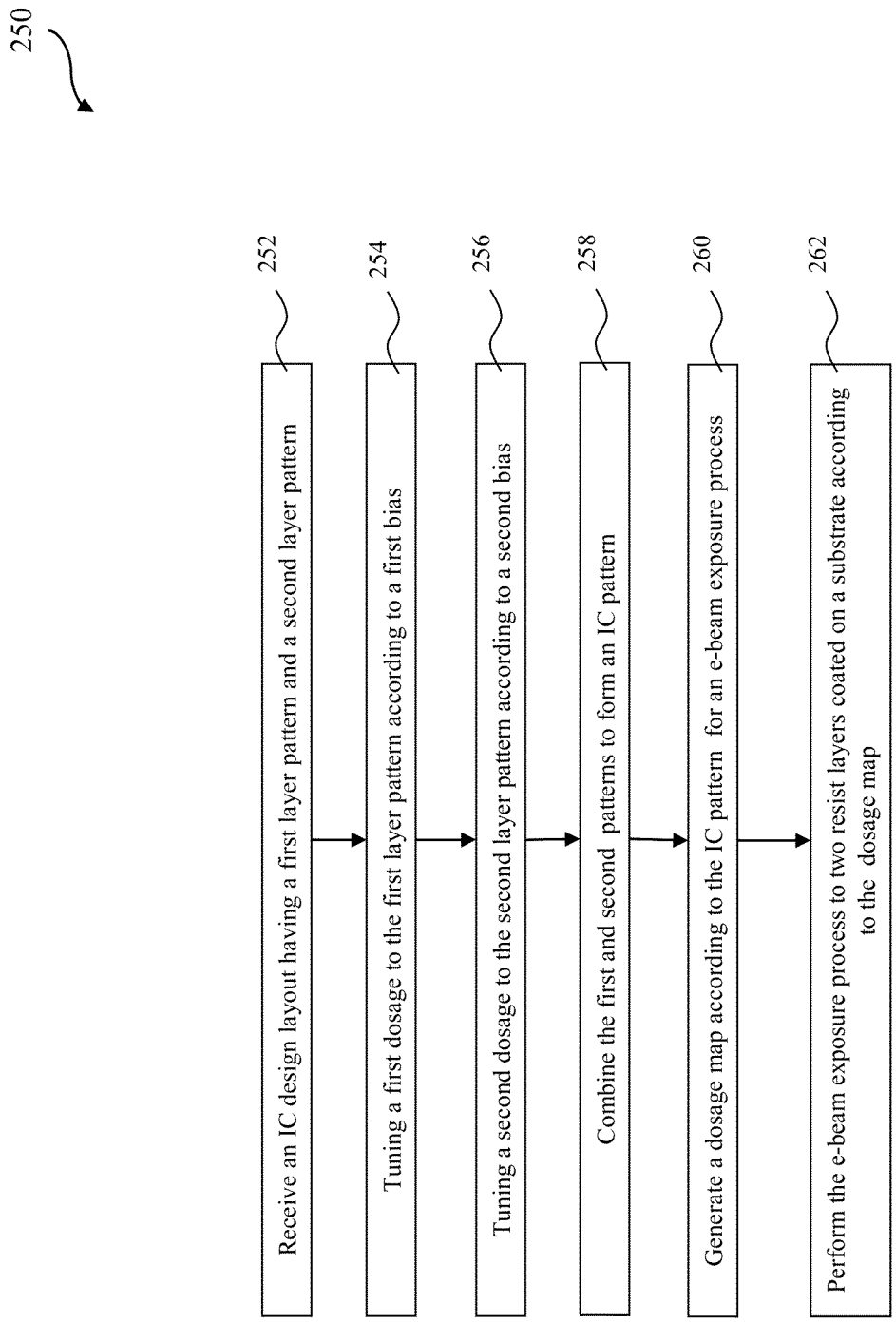
FIG. 23 is a flowchart of a method for generating a dosage map according to one or more embodiments of the present disclosure.

The present disclosure also provides a method for generating a dosage map, such as the dosage map 80, which can be used in the method 200 of FIG. 22. FIG. 23 is a flowchart of a method 250 of generating a dosage map that defines an IC pattern thereon.

The method 250 begins at operation 252 by receiving an IC design layout that includes a first layer pattern and a second layer pattern. The first layer pattern is designed to expose a first resist layer by an e-beam lithography exposure process and furthermore, to be formed in a first material layer on a substrate (such as a semiconductor wafer) and the second layer pattern is designed to expose a second resist layer by the lithography exposure process and furthermore, to be formed in a second material layer overlying the first material layer. In one embodiment for illustration, the first layer pattern includes a via pattern having a via feature (or a plurality of via features), and the second layer pattern is a metal line pattern having one metal line (or a plurality of metal lines).

The method 250 proceeds to operation 254 by adjusting the dosage level (and dimensions) of the first layer pattern according to a first bias. The first bias is chosen such that the first resist layer is exposed to form a first latent pattern with proper dimensions, such as the via feature having proper dimensions.

The method 250 proceeds to operation 256 by adjusting the dosage level (and dimensions) of the second layer pattern according to a second bias. The second bias chosen such that the second resist layer is exposed to form a second latent pattern with proper dimensions, such as the metal line having proper dimensions. The first and second biases are different from each other in order to differentiate exposure intensities and form different latent patterns on the two resist layers.

By different biases for the first layer pattern and the second layer pattern, the exposure radiation intensity difference between the first and second layer patterns is achieved. As an example illustrated in FIG. 5, the intensity I3 associated with the first layer pattern is different from (Specifically, greater than) the intensity I4 associated with the second layer pattern due to different biases. With this intensity difference, the first layer pattern can be selectively imaged to the first resist layer while the second layer pattern is not imaged to the first resist layer (such as by choosing different exposure thresholds and/or attenuation).

The method 250 proceeds to operation 258 by combining the first and second adjusted (with different dosages and possibly further with dimensions adjustment) layer patterns to form a combined IC pattern. The combined IC pattern is a sum of the first and second adjusted layer patterns associated with respective dosages. For example illustrated in FIG. 8, the first adjusted pattern includes the via feature 16 with first dosage D1 and possibly with the first size bias (such as Vx is less than Lx in the present example). The second adjusted pattern includes the metal line 14 with the second dosage D2. The first and second adjusted patterns are combined according to the spatial relationship when formed on the substrate (the spatial relationship between the via pattern and metal line pattern). In the embodiment illustrated in FIG. 8, the via feature 16 and the metal line 14 are aligned and overlapped when formed in the substrate in the top view. Furthermore, the via feature 16 has a dimension Vx and the metal line 14 has a dimension Lx greater than Vx in the combined IC pattern since the first bias and the second bias are different.

The method 250 proceeds to operation 260 by generating a dosage map (such as dosage map 10 in FIG. 1 or dosage map 80 in FIG. 8) according to the combined IC pattern for an e-beam exposure process (or alternatively for a lithography exposure process using other charged particles, such as ion-beam). The dosage map defines the combined IC pattern with respective dosages.

The method 250 may proceed to operation 262 by performing an e-beam exposure process to two resist layers coated on a substrate (such as a semiconductor wafer) according to the dosage map with the combined IC pattern defined thereon, thereby forming different latent patterns in the two resist layers, as described in the one embodiment illustrated in FIGS. 6 and 7. The operation 262 may include other processes to form two respective patterns on the respective material layers of the substrate from the two latent patterns, as described FIGS. 9-21 according to one embodiment. In another embodiment, the operation 262 may coat two resist layers on a mask substrate for making a mask having three states, as further described below.

Figure 24:
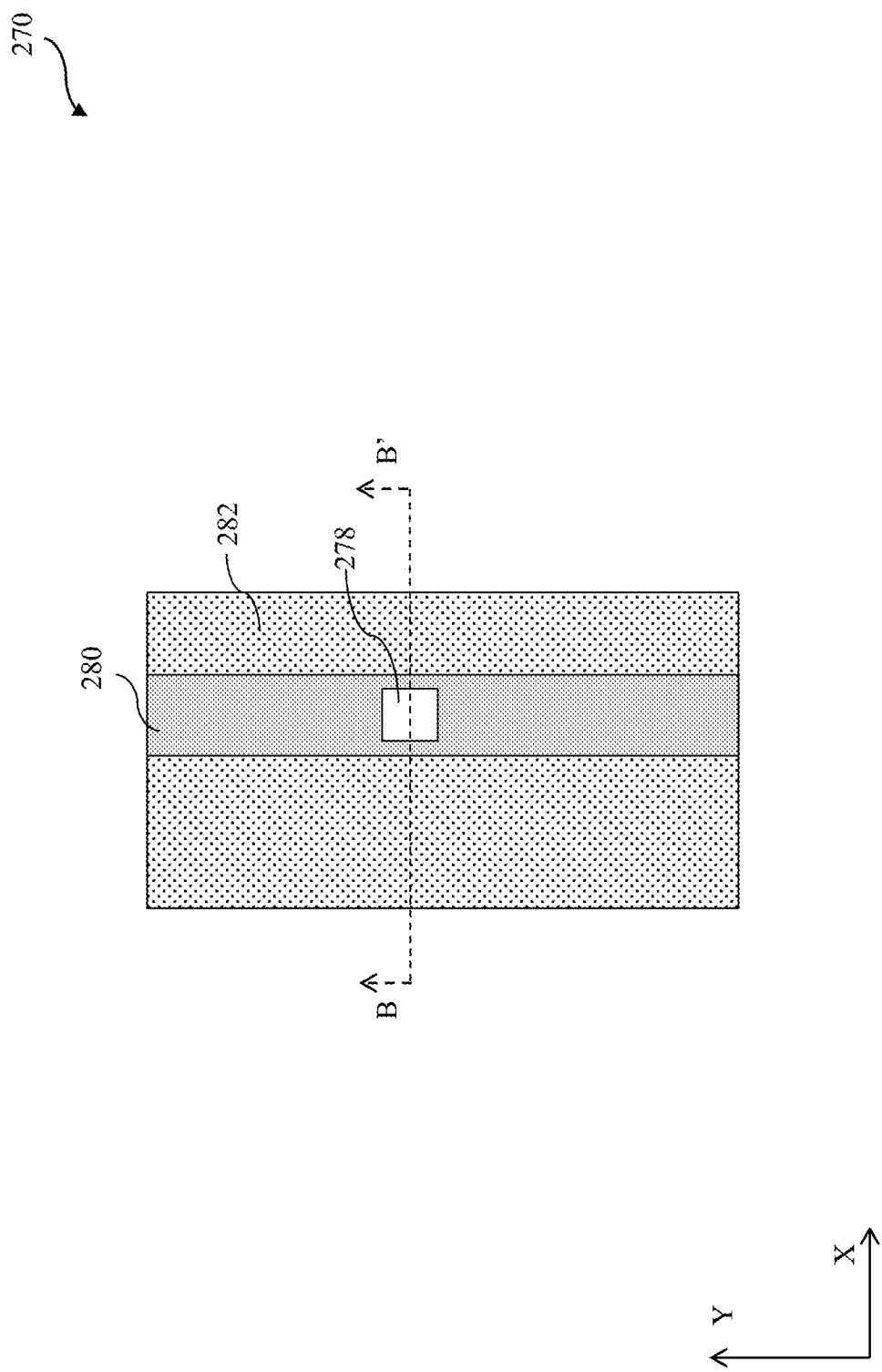
FIGS. 24 and 25 are, respectively, a top view and a sectional view of a photomask constructed according to aspects of the present disclosure in one embodiment.
Figure 25:
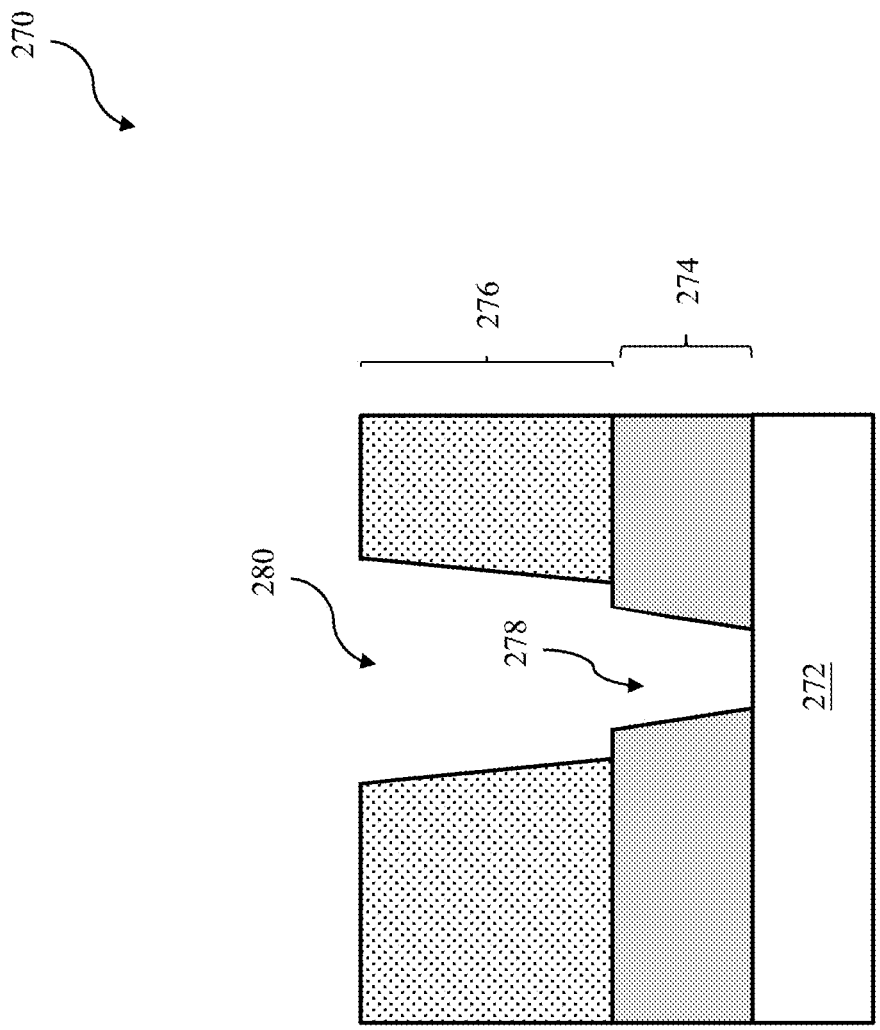

FIG. 24 is a top view of a photomask (reticle or mask) 270 and FIG. 25 is a sectional view of the photomask 270 along the dashed line BB' constructed according to one embodiment. The mask 270 includes a mask substrate 272. The mask substrate 272 may be a transparent substrate, such as a fused quartz substrate. The mask 270 includes a first mask material layer 274 having a first transmittance to the exposure radiation during a lithography exposure process (such as ultraviolet-UV, or deep UV-DUV) and disposed on the mask substrate 272. The mask 270 includes a second mask material layer 276 having a second transmittance and disposed on the first mask material layer 274. The first and second transmittances are different from each other. In the present embodiment, the first transmittance is greater than the second transmittance. In Furtherance of the present embodiment, the second transmittance is around zero. In an alternative embodiment, a capping layer (such as another MoSi layer) may be formed on the second mask material layer 276 to prevent or reduce the reflection.

In the present embodiment, the first mask material layer 274 includes molybdenum silicon (MoSi). The first mask material layer 274 may alternatively include other material with proper transmittance, such as zirconium silicon oxide (ZrSiO), silicon nitride (SiN), and/or titanium nitride (TiN). The first mask material layer 274 is designed to have a suitable thickness for proper transmittance. In one example, the thickness of the first mask material layer 272 ranges between about 5 nm and about 40 nm.

In the present embodiment, the second mask material layer 276 includes chromium (Cr). In one example, the thickness of the second mask material layer 274 ranges between about 5 nm and about 80 nm.

The first and second mask material layers are patterned to form various openings. Particularly, the first mask material layer 274 is patterned to form one or openings 278. The second mask material layer 276 is patterned to form one or more openings 280. Especially, the mask 270 includes three states that response differently to the radiation beam during a lithography exposure process using the mask 270. The first state is defined in the regions, such as opening 278, where there are no first and second mask material layers but only the mask substrate 272. The second state is defined in the regions, such as opening 280, where there are no second mask material layer 276 but the first mask material layer 274 and the mask substrate 272. The third state is defined in the field region 282 without any pattern, where both the first and second mask material layers 274 and 276 are present.

Various openings in the mask 270 define an IC pattern from multiple layer patterns. The multiple layer patterns are combined together and are defined in the same mask 270. In the present embodiment, the opening 278 defines a feature (also referred by the numeral 278) in a first layer pattern of an integrated circuit, and the opening 280 defines a feature (also referred by the numeral 280) in a second layer pattern of the integrated circuit. The first layer pattern and the second layer pattern are portion of the integrated circuit. For example, the first layer pattern is a via pattern having one or more via features and the second layer pattern is a metal line pattern having one or more metal lines. The via pattern and the metal line pattern are collectively a portion of an interconnect structure in the integrated circuit.

Especially, the feature 278 from the first layer pattern has third transmittance. The feature 280 from the second layer pattern has the first transmittance less than the third transmittance. The field 282 has the second transmittance less than the first transmittance. In the present example, the third transmittance is the highest, the second transmittance is around zero, and the first transmittance is between the second and third transmittance. It is noted that the mask 270 may be a portion of a large mask and only illustrates exemplary features without intention to limit. For example, the first layer pattern may include more than one feature 278. Similarly, the second layer pattern may include more than one feature 280. In the present example, the feature 278 from the first layer pattern is overlapped with the feature 280 from the second layer pattern, as illustrated in FIG. 24.

In the present embodiment, the mask 270 is formed by the method 200 using the dosage map 80 described above. For the sake of example, the following discussion will further describe the mask 270 (shown in FIGS. 26-36 at various fabrication stages) and the method making the same according to one or more embodiments.

Figure 26:
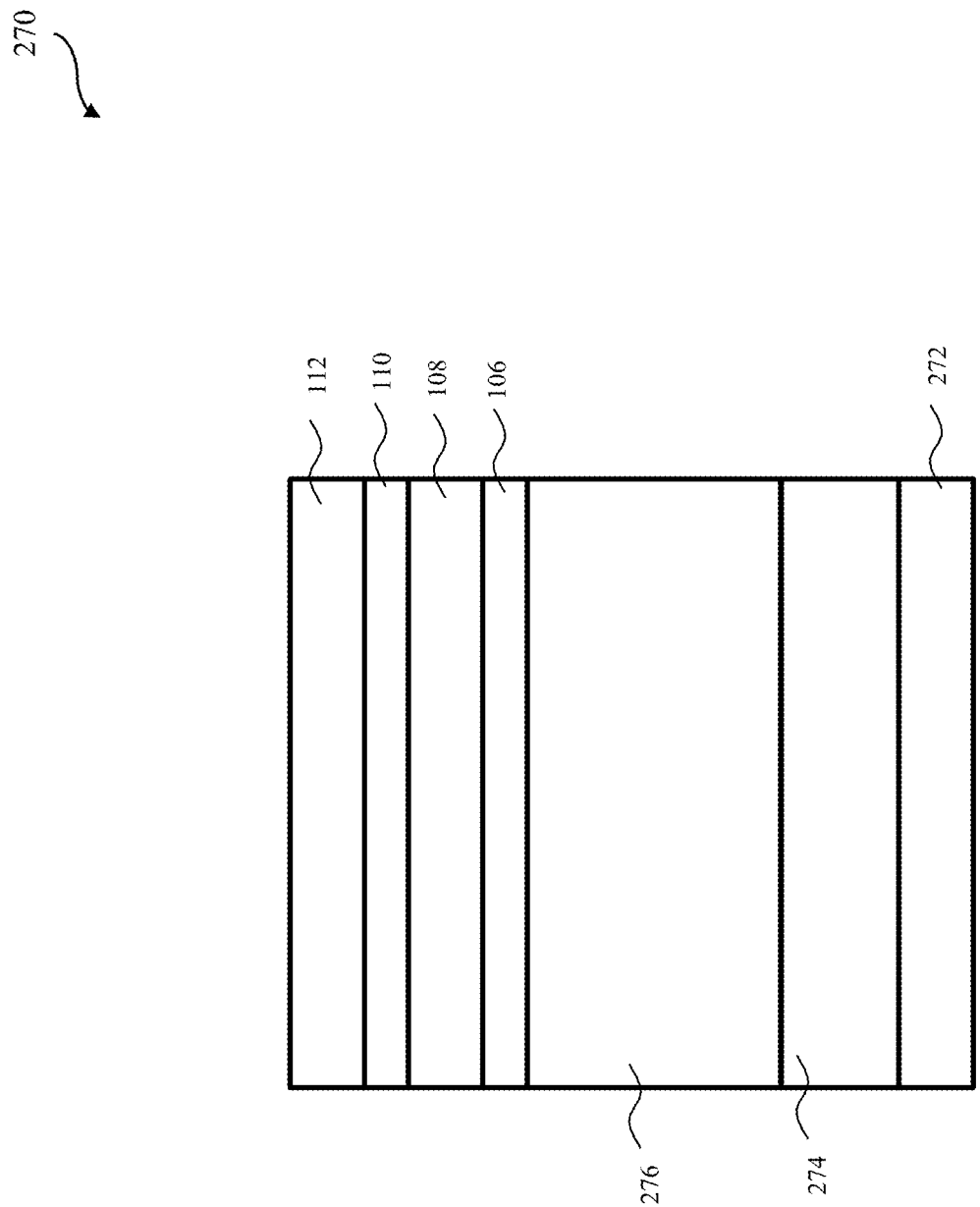
FIGS. 26 through 36 are sectional views of a photomask at various fabrication stages constructed according to one or more embodiments of the present disclosure.

Referring to FIG. 26, a mask substrate 272 is provided. In the present embodiment, the mask substrate 272 includes fuse quartz or other suitable material.

Still referring to FIG. 26, various material layers are formed on the substrate 272. In the present embodiment, the first mask material layer 274 is formed on the substrate 272, and the second mask material layer 276 is formed on the first mask material layer 274. The formation of the first and second mask material layers may be achieved by a suitable technique, such as physical vapor deposition (PVD).

Two resist layers are subsequently formed on the second mask material layer 276. Specifically, a first resist layer 108 is formed over the second mask material layer 276. The first resist layer 108 is formed by spin-on coating or other suitable technique. A second resist layer 112 is formed over the first resist layer 108. The second resist layer 112 is formed by spin-on coating or other suitable technique. Other steps, such as baking, may follow the coating of each resist layer. The first and second resist layers may have similar or different compositions from each other, according to various embodiments. Two resist layers include a same resist material or different resist materials sensitive to e-beam radiation. In one example, the resist material includes PMMA.

The first and second resist layers 108 and 112 are same to the resist layers 108 and 112 in FIG. 9, respectively. The detailed description is not repeated here for simplicity. In one embodiment, the second resist layer 112 is different from the first resist layer 108 and is formed directly on the first resist layer 108.

In another embodiment, a material layer 110 is formed between the first and second resist layers. In this embodiment, the two resist layers may be same in composition or different. The material layer 110 is inserted there-between to serve one or more functions, described above in FIG. 9. The material layer 110 includes a dielectric material, such as aluminum oxide ($Al_2O_3$), silicon oxide ($SiO_2$), silicon nitride (SiN), titanium oxide (TiO), or other suitable material. The material layer 110 is formed by spin-on coating or low temperature deposition without damage to the underlying resist layer 108.

In another embodiment, a second material layer 106 is formed between the second mask material layer 276 and the first resist layer 108. In the present embodiment, the second material layer 106 functions as a hard mask during the subsequent operations to pattern the mask material layers. The second material layer 106 may be different from the material layer 110 or alternatively same. For example, the second material layer 106 may include MoSi or other suitable material.

Figure 27:
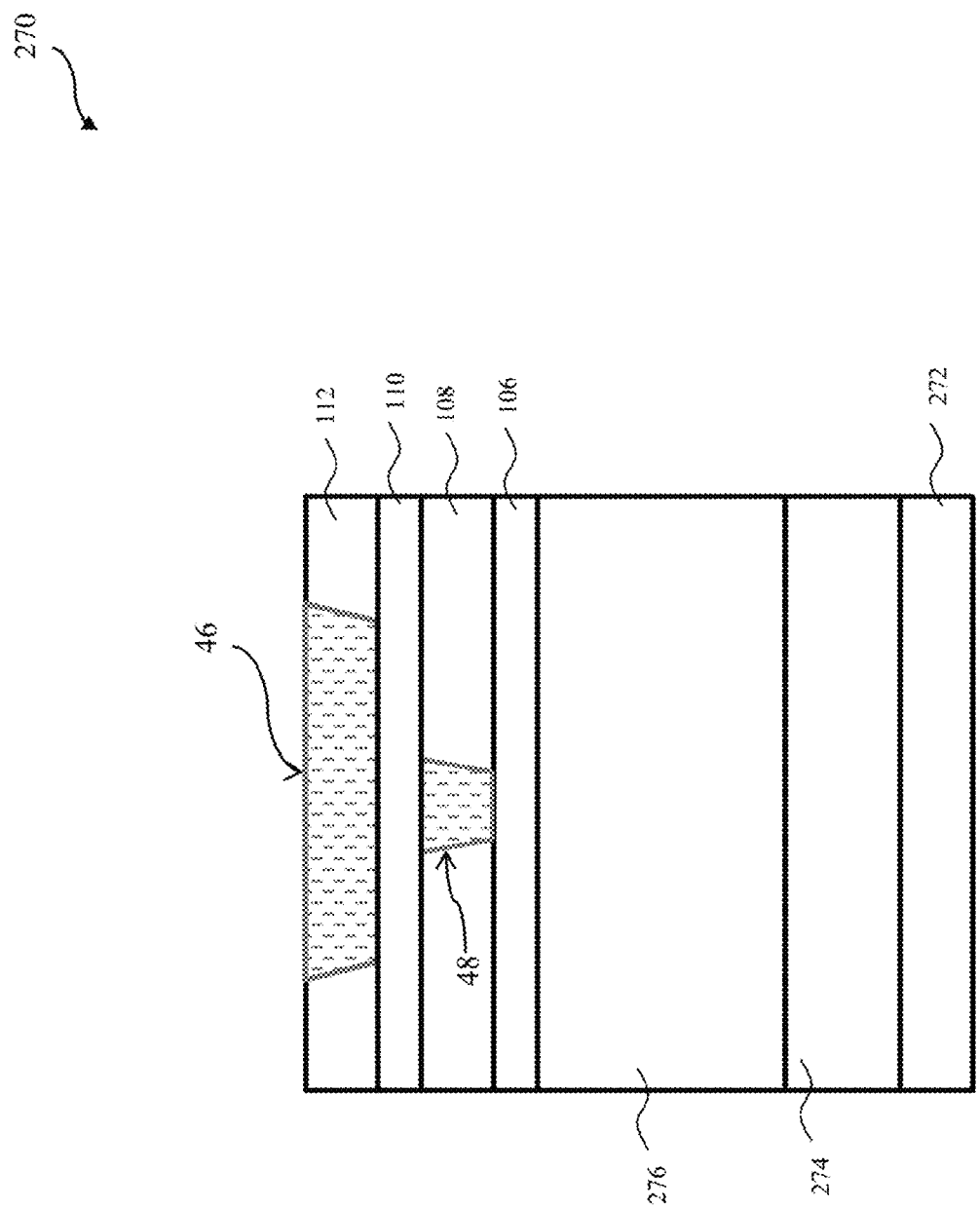

Referring to FIG. 27, an e-beam lithography exposure process is implemented using the dosage map 80 to simultaneously expose both the first and second resist layers, thereby forming latent patterns on respective resist layers. During the e-beam lithography exposure process, the IC pattern defined in the dosage map 80 is imaged to the second resist layer 112 and the first resist layer 108. A first latent pattern is formed in the first resist layer 108 and a second latent pattern is formed in the second resist layer 112. A latent pattern is referred to as a portion of the resist layer that is exposed but not developed yet. The first and second latent patterns are different from each other due to different exposing intensities, different exposure thresholds or both, as described above with reference to FIGS. 1 through 7. However, the first and second latent patterns are related since both are images of the same IC pattern defined on the dosage map 80. In the present example, the first latent pattern 40 includes a first latent feature 48 associated with the via feature 16 and the second latent pattern 42 includes a second latent feature 46 associated with the line feature 14 defined in the dosage map 80.

The e-beam lithography exposure process may be implemented in various modes, including vector mode and raster mode. In one example, the e-beam lithography exposure process is implemented in a raster mode where the exposure dosage is dynamically varying according to the dosage map 80. In another example, the e-beam lithography exposure process is implemented in a vector mode where the line feature 14 and the via feature 16 are sequentially written with the respective dosage. Specifically, the via feature 16 is written using the first dosage D1 and thereafter the line feature 14 is written using the second dosage D2, or vice versa. More generally, the features in the first layer pattern are written using the first dosage D1 and thereafter the features in the second layer pattern are written using the second dosage, or vice versa. The field region 18 is not written since the corresponding dosage D3 is zero. Thus, the dosage, accordingly the e-beam intensity is not frequently changed. Other operations, such as post-exposure-baking (PEB), may follow the lithography exposure process.

Figure 28:
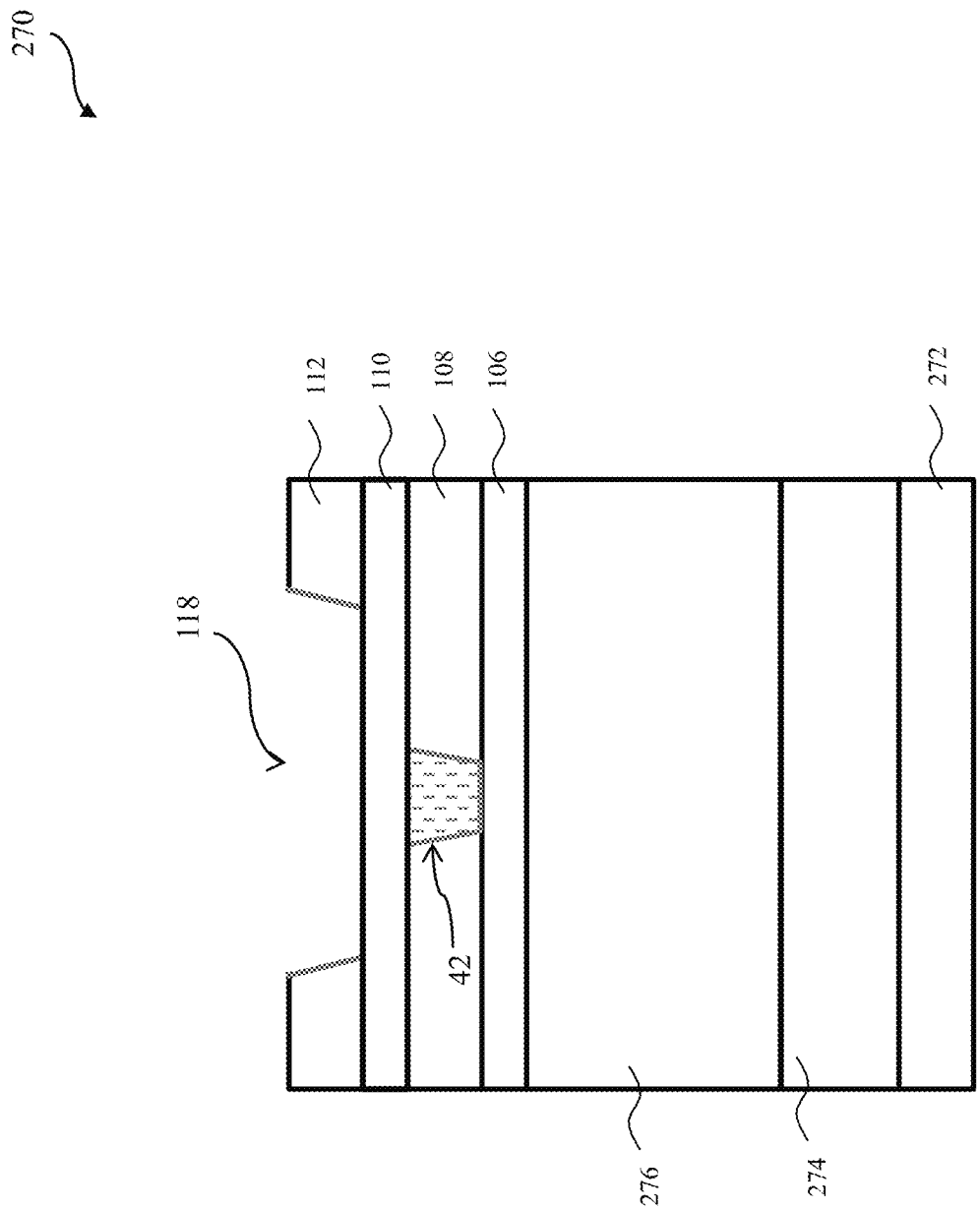

Referring to FIG. 28, the second resist layer 112 is developed by the corresponding developer. In the present embodiment, both the first and second resist layers are positive tone. The exposed portion (the latent feature 46) of the second resist layer 112 is removed in the developer, thereby forming a patterned second resist layer having an opening 118 associated with the second latent feature 46. Other operations, such as hard baking, may follow the developing process.

Figure 29:
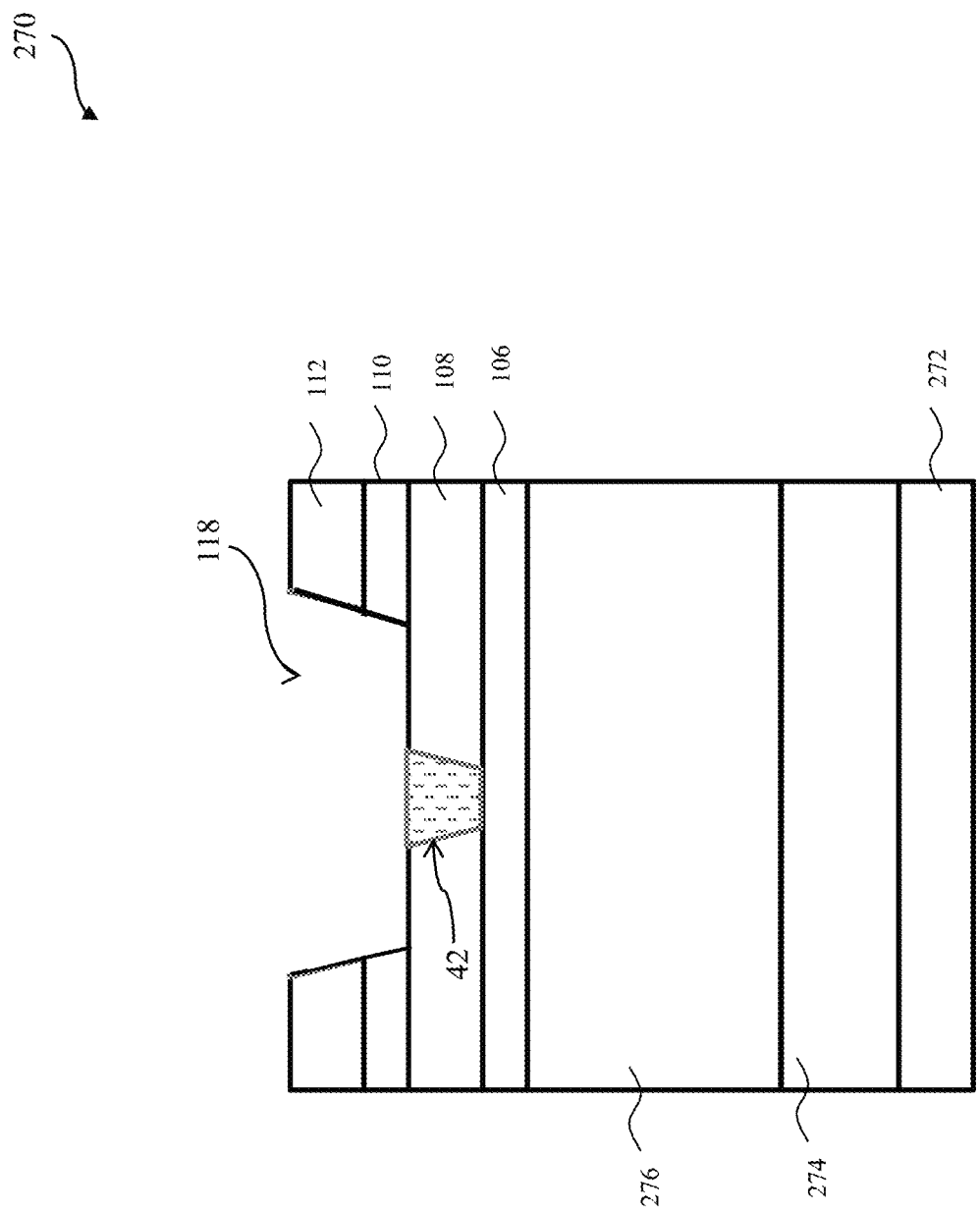

Referring to FIG. 29, an etch process is applied to selectively etch the material layer 110 and remove the portion of the material layer 110 aligned within the opening 118. The etch process and the etchant are properly chosen for selective etch without damage to the resist.

Figure 30:
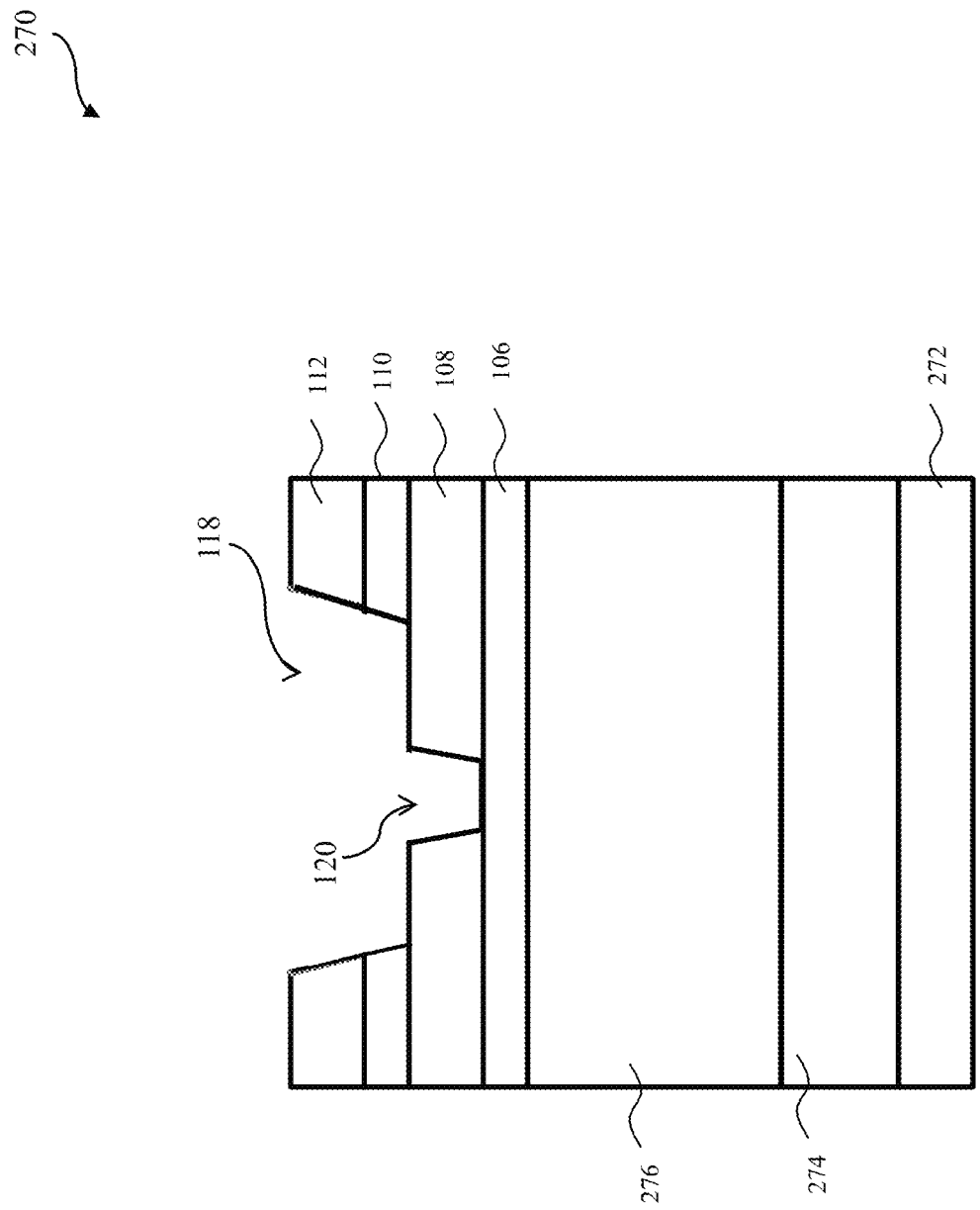

Referring to FIG. 30, the first resist layer 108 is developed by the corresponding developer. In the present embodiment, the first resist layer is positive tone. The exposed portion (the first latent feature 48) is removed in the developer, thereby forming a patterned first resist layer having an opening 120 associated with the first latent feature 48. Other operations, such as hard baking, may follow the developing process.

Figure 31:
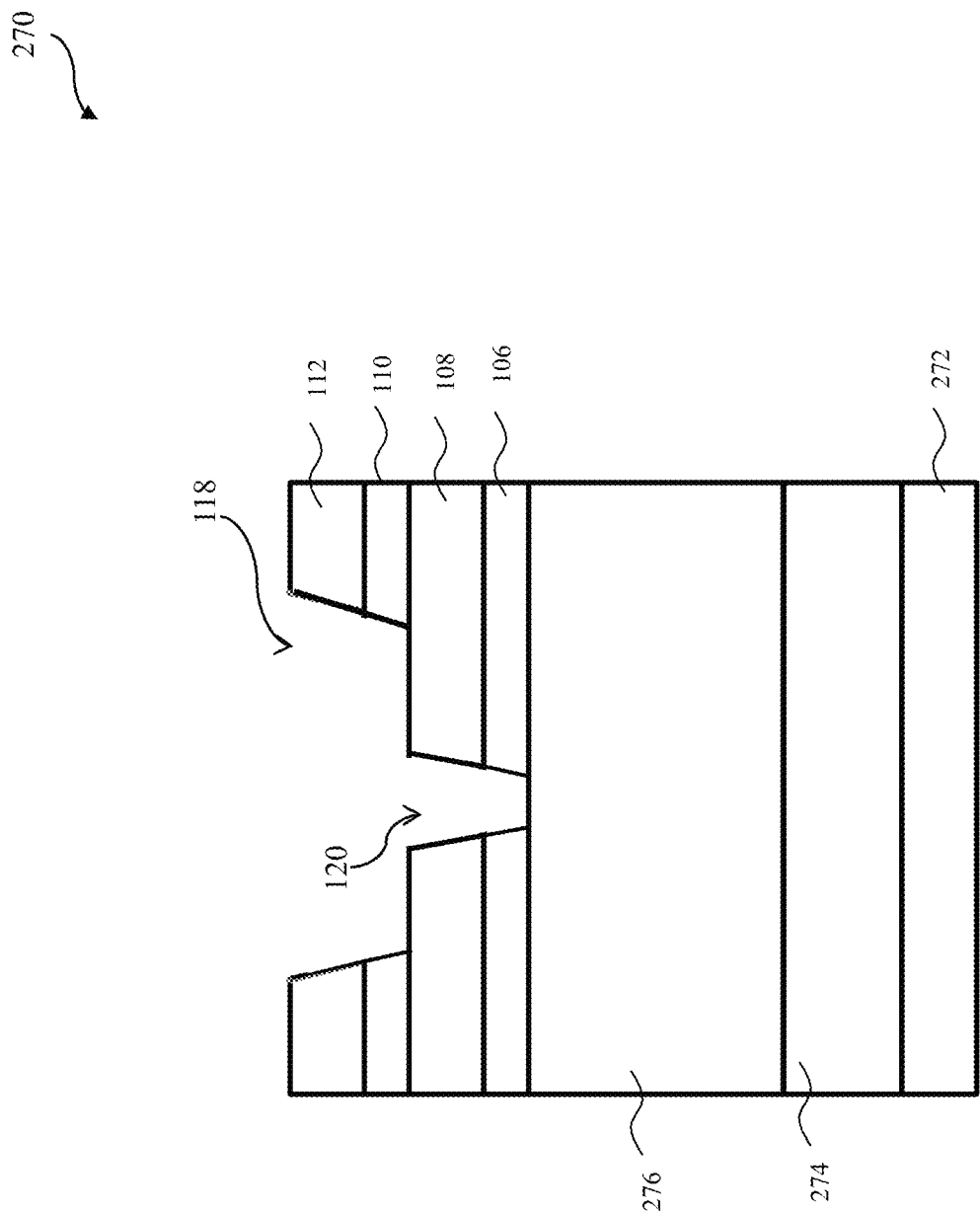

Referring to FIG. 31, another etch process is applied to selectively etch the second material layer 106 and removes the portion of the second material layer 106 aligned with the opening 120 uncovered by the patterned first resist layer 106. The etch process and the etchant are properly chosen for selective etch without damage to the resist.

Figure 32:
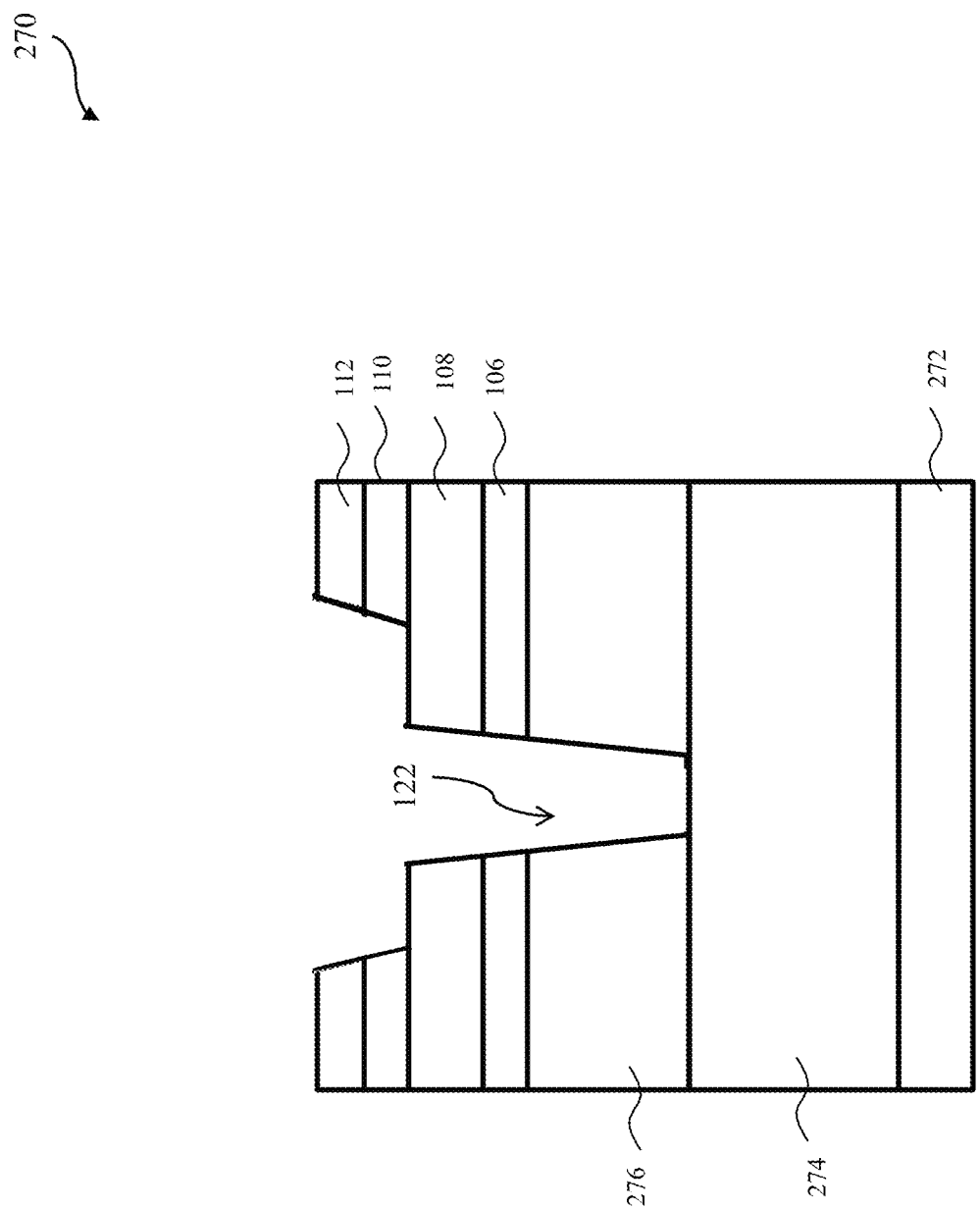

Referring to FIG. 32, an etch process is applied to selectively etch the second mask material layer 276 within the opening 120, thereby forming a trench 122 in the second mask material layer 276. The etch process is properly chosen to form the trench 122. For example, dry etch, wet etch, or a combination thereof, may be applied for transferring the opening 120 to the second mask material layer 276, forming the trench 122.

Figure 33:
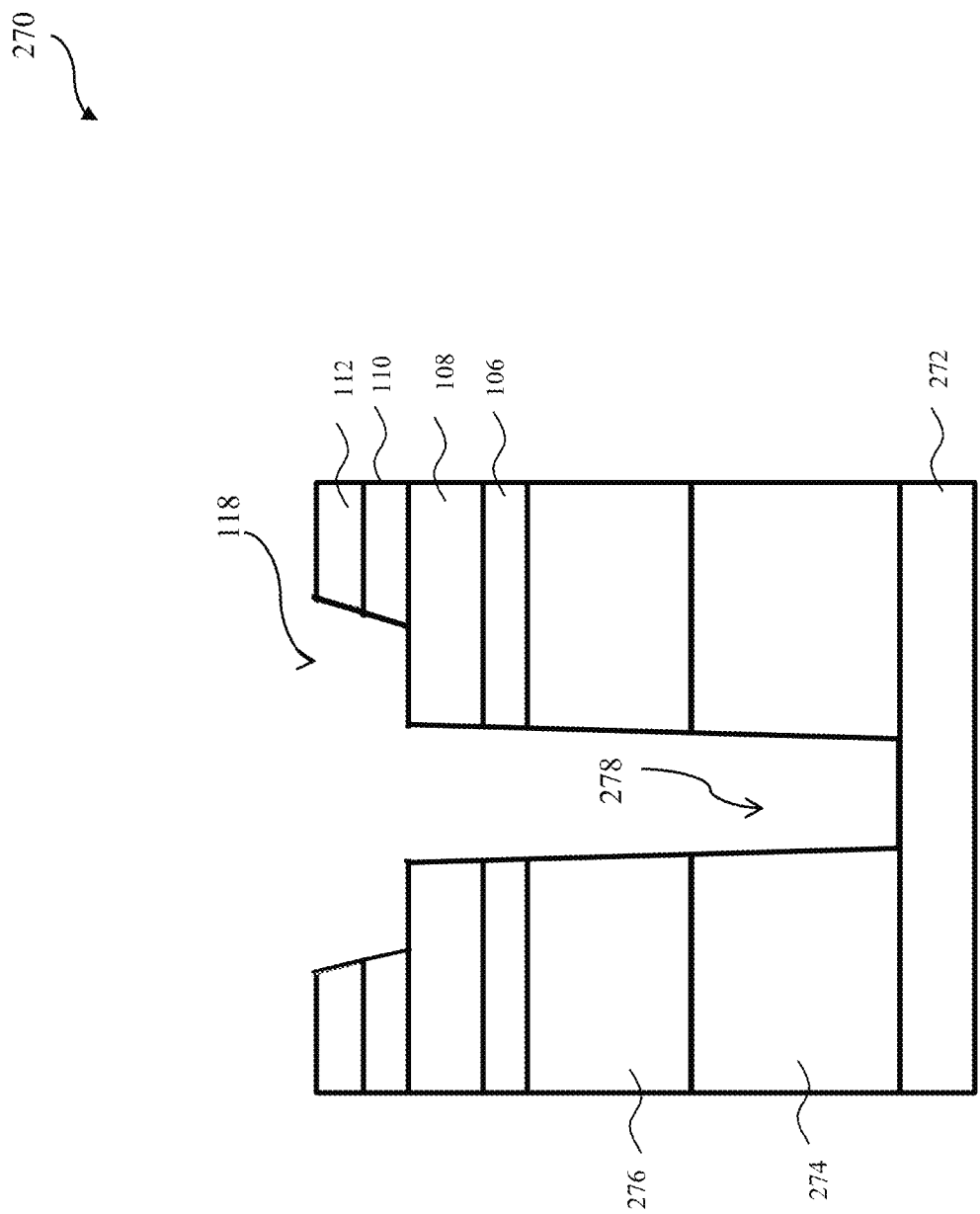

Referring to FIG. 33, another etch process is applied to selectively etch the first mask material 274 within the trench 122 using a suitable etch technique and etchant, thereby forming the trench (opening) 278 in the first mask material layer 274.

Figure 34:
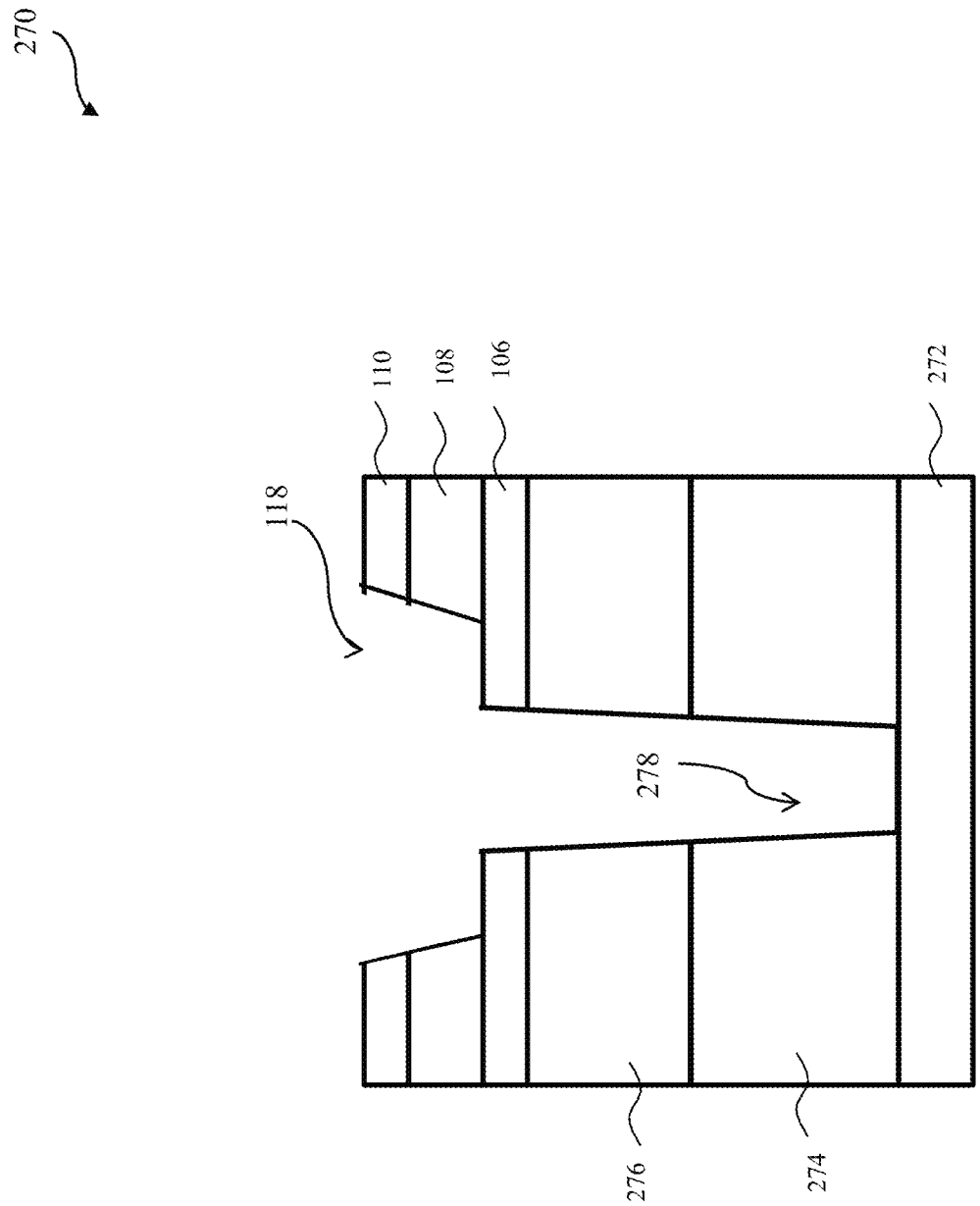

Referring to FIG. 34, a trimming process is applied to trim the first resist layer 112, thereby transferring the opening 118 from the material layer 110 to the first resist layer 108. The uncovered portion of the first resist layer 108 is removed by the trimming process. The second resist layer 112 is removed by the trimming process as well. In one embodiment, the trimming process is similar to a resist strip process. For example, the trimming process implements wet stripping.

Figure 35:
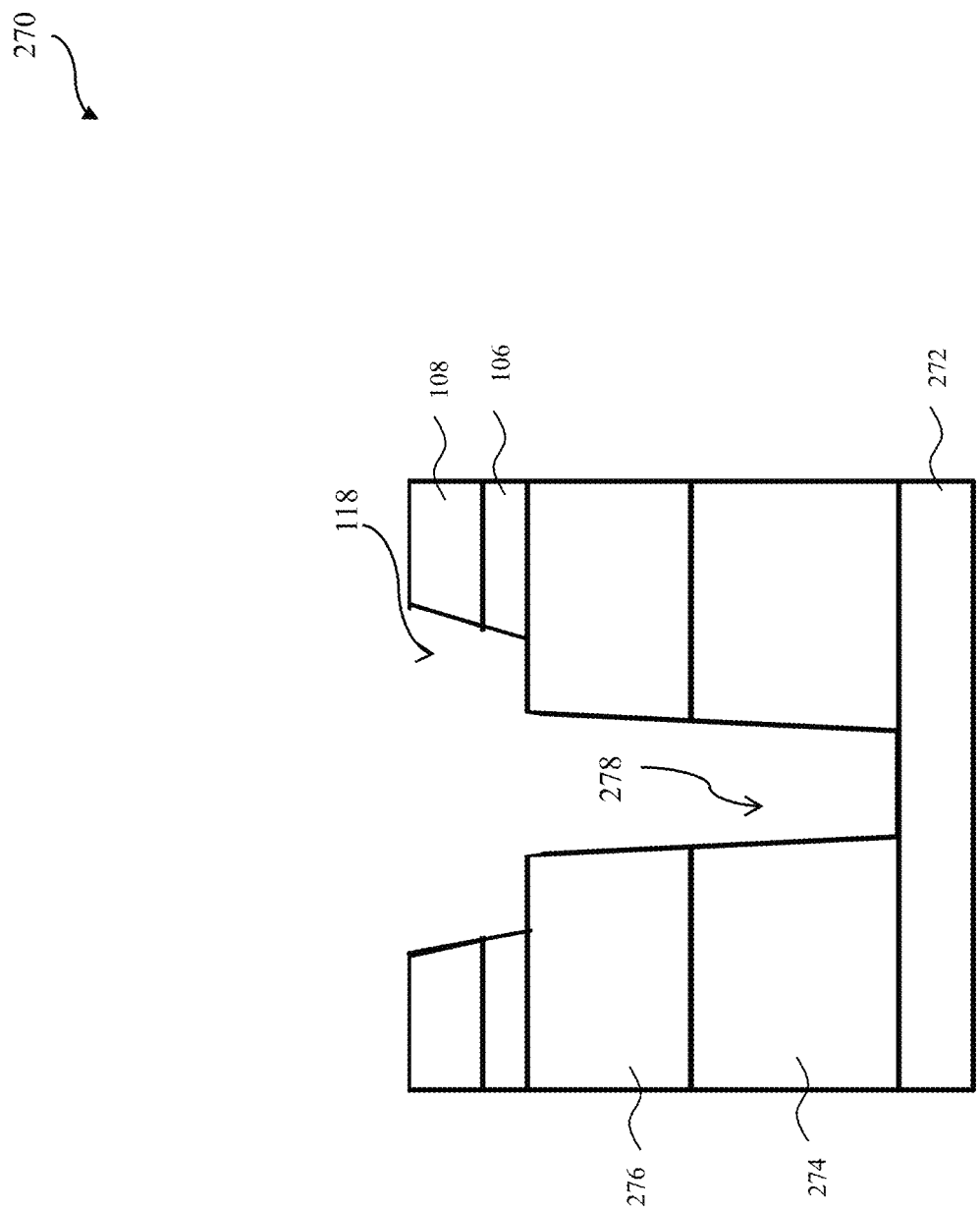

Referring to FIG. 35, an etch process is applied to etch the material layer 106 within the opening 118, thereby transferring the opening 118 to the material layer 106. In one embodiment, the material layer 106 and the material layer 110 includes a same material (such as aluminum oxide), the etch process opens the material layer 106 and removes the material layer 110 as well.

Figure 36:
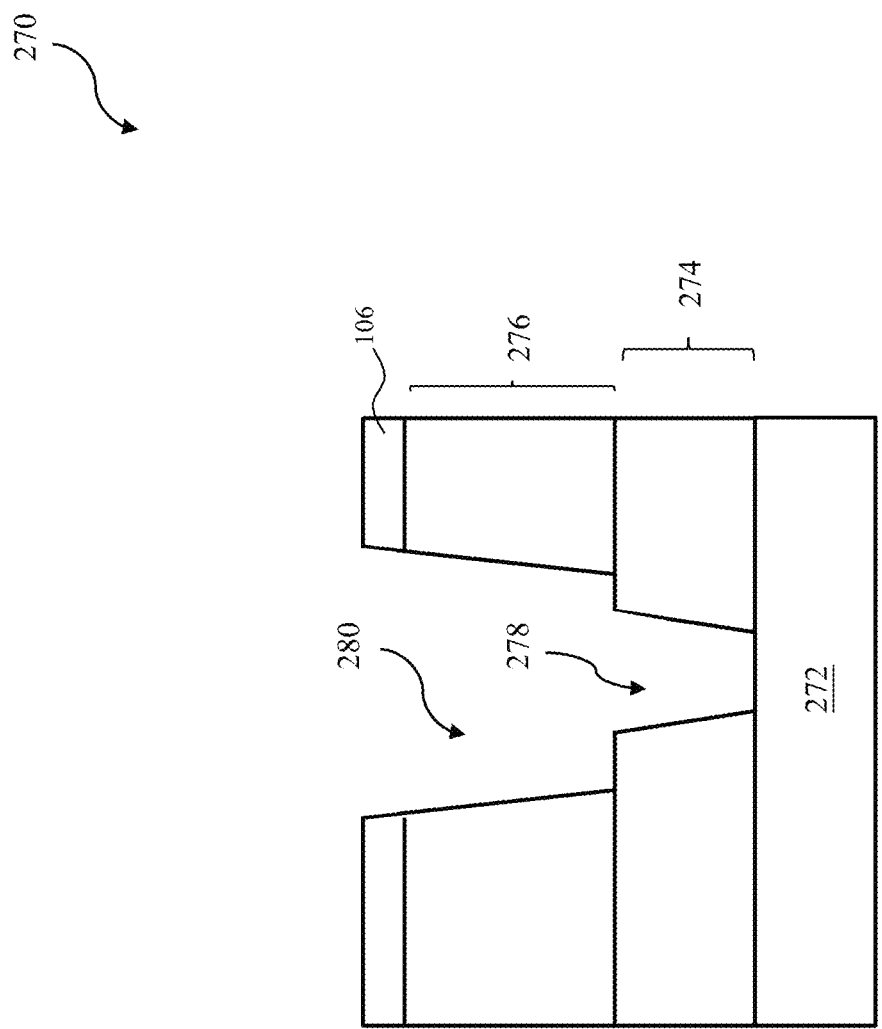

Referring to FIG. 36, another etch process is applied to selectively etch the second mask material layer 276 using the material layer 106 as an etch mask, thereby forming the trench (opening) 280 in the second mask material layer 276. The first resist layer 108 is removed by wet stripping or plasma ashing.

In one embodiment, the material layer 106 is removed thereafter by an etch process. In another embodiment, the material layer 106 remains as a protection layer.

Although embodiments of the present disclosure have been described in detail, those skilled in the art should understand that they may make various changes, substitutions and alterations herein without departing from the spirit and scope of the present disclosure. For example, more than two resist layers (such as three resist layers) are simultaneously exposed by a single e-beam lithography exposure process using a dosage map having more than three dosage levels, such as features in each layer pattern are defined by a respective dosage. In another example, the mask 270 may be designed as a reflective mask for extreme UV (EUV) lithography. In this example, the mask substrate 272 includes a low thermal expansion material (LTEM) substrate and the first mask material 274 includes reflective multiple layers, such pairs of Mo and Si layers designed to reflect EUV radiation.

Thus, the present disclosure provides a method that includes forming a first patternable material layer on a substrate; forming a second patternable material layer over the first patternable material layer, and performing a charged particle beam lithography exposure process to the first patternable material layer and the second patternable material layer, thereby forming a first latent feature in the first patternable material layer and a second latent feature in the second patternable material layer.

The present disclosure also provides a method that includes forming a first patternable material layer on a substrate; forming an intermediate material layer on the first patternable material layer, forming a second patternable material layer on the intermediate material layer, and performing a charged particle beam lithography exposure process to the first patternable material layer and the second patternable material layer according to a dosage map with 3 dosage levels, thereby simultaneously forming a first latent feature in the first patternable material layer and a second latent feature in the second patternable material layer.

The present disclosure also provides a method that includes receiving an integrated circuit (IC) design structure having a first layer pattern and a second layer pattern, wherein the first layer pattern defines at least a first feature to be formed in a first material layer on a substrate and the second layer pattern defines at least a second feature to be formed in a second material layer disposed on the first material layer; and generating a charged particle beam writing dosage map that defines a combined pattern of the first layer pattern and the second layer pattern.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    forming a first patternable material layer on a substrate;
    forming a second patternable material layer over the first patternable material layer; and
    performing a charged particle beam lithography exposure process to the first patternable material layer and the second patternable material layer, thereby forming a first latent feature in the first patternable material layer.

2. The method of claim 1, wherein the performing of the charged particle beam lithography exposure process forms a second latent feature in the second patternable material layer.

3. The method of claim 2, wherein
    the charged particle beam lithography exposure process uses a dosage map having three dosage levels; and
    the dosage map includes a first dosage level to define a first main feature that is deigned to form the first latent feature in the first patternable material layer and a second dosage level to define a second main feature that is designed to form the second latent feature in the second patternable material layer.

4. The method of claim 3, wherein the performing of the charged particle beam lithography exposure process includes writing the first main feature using the first dosage level and writing the second main feature using the second dosage level less than the first dosage level.

5. The method of claim 3, wherein
    the dosage map includes a third dosage level to define a background region;
    the third dosage level is zero; and
    the first and second dosage levels are greater than zero.

6. The method of claim 2, further comprising:
    developing the first patternable material layer to form a first main feature from the first latent feature; and
    developing the second patternable material layer to form a second main feature from the second latent feature.

7. The method of claim 6, further comprising, before forming the first patternable material layer:
    forming a first material layer on the substrate; and
    forming a second material layer on the first material layer.

8. The method of claim 7, further comprising, after the developing the first patternable material layer and the developing the second patternable material layer:
    transferring the first main feature to the first material layer; and transferring the second main feature to the second material layer.

9. The method of claim 7, wherein
the substrate is a mask substrate;
the first material layer is a molybdenum silicon (MoSi) layer; and
the second material layer is a chromium (Cr) layer.

10. The method of claim 7, wherein
the substrate is a semiconductor substrate;
the first material layer is a first dielectric material layer;
the second material layer is a second dielectric material layer;
transferring the first main feature to the first material layer includes forming a via trench in the first material layer; and
transferring the second main feature to the second material layer includes forming a metal line trench in the second material layer.

11. The method of claim 2, wherein the second latent feature is overlapped with the first latent feature in a top view toward the substrate.

12. The method of claim 1, wherein
the first patternable material layer is sensitive to a charged particle beam used in the charged particle beam lithography exposure process and has a first exposure threshold; and
the second patternable material layer is sensitive to the charged particle beam and has a second exposure threshold less than the first exposure threshold.

13. The method of claim 1, further comprising forming a material layer between the first and second patternable layers, wherein the material layer is insensitive to a charged particle beam used in the charged particle beam lithography exposure process and attenuates the charged particle beam.

14. A method, comprising:
forming a first patternable material layer on a substrate;
forming an intermediate material layer on the first patternable material layer;
forming a second patternable material layer on the intermediate material layer; and
performing a charged particle beam lithography exposure process to the first patternable material layer and the second patternable material layer according to a dosage map with 3 dosage levels, thereby forming a first latent feature in the first patternable material layer.

15. The method of claim 14, wherein performing the charged particle beam lithography exposure process forms a second latent feature in the second patternable material layer simultaneously with the first latent feature.

16. The method of claim 15, further comprising:
developing the second patternable material layer to form a first main feature from the second latent feature;
developing the first patternable material layer to form a second main feature from the first latent feature;
transferring the first main feature to a first material layer by a first etch process; and
transferring the second main feature to a second material layer by a second etch process.

17. The method of claim 14, wherein the intermediate material layer includes a dielectric material deposited by low temperature and selected from the group consisting of silicon oxide, silicon nitride and titanium nitride.

18. A method, comprising:
receiving an integrated circuit (IC) design structure having a first layer pattern and a second layer pattern, wherein the first layer pattern defines at least a first feature to be formed in a first material layer on a substrate and the second layer pattern defines at least a second feature to be formed in a second material layer disposed on the first material layer.

19. The method of claim 18, further comprising, generating a charged particle beam writing dosage map that defines a combined pattern of the first layer pattern and the second layer pattern, wherein the charged particle writing dosage map is defined such that the first feature has a first dosage and a second feature has a second dosage less than the first dosage.

20. The method of claim 19, further comprising:
coating a first patternable material layer on a substrate;
coating a second patternable material layer on the first patternable material layer; and
performing a charged particle beam exposure process to the first and second patternable material layers based on the charged particle beam writing dosage map, thereby simultaneously forming a first latent feature of the first feature in the first patternable material layer and a second latent feature of the second feature in the second patternable material layer.

* * * * *